(12) United States Patent
Moriwaki

(10) Patent No.: US 8,824,197 B2
(45) Date of Patent: Sep. 2, 2014

(54) STATIC RAM

(75) Inventor: Shinichi Moriwaki, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 128 days.

(21) Appl. No.: 13/561,420

(22) Filed: Jul. 30, 2012

(65) Prior Publication Data

US 2013/0039120 A1 Feb. 14, 2013

(30) Foreign Application Priority Data

Aug. 9, 2011 (JP) ................................ 2011-173764

(51) Int. Cl.
| | | |
|---|---|---|
| *G11C 11/00* | (2006.01) | |
| *G11C 11/419* | (2006.01) | |
| *G11C 7/12* | (2006.01) | |

(52) U.S. Cl.
CPC ............... *G11C 7/12* (2013.01); *G11C 11/419* (2013.01)
USPC 365/154; 365/230.03; 365/207; 365/189.011; 365/202; 365/156

(58) Field of Classification Search
CPC .. G11C 11/4091; G11C 11/4097; G11C 7/12; G11C 7/18; G11C 11/4094; G11C 7/062; G11C 11/419; G11C 11/416

USPC ............. 365/230.03, 154, 207, 189.011, 201, 365/156

See application file for complete search history.

(56) References Cited

U.S. PATENT DOCUMENTS

| | | | |
|---|---|---|---|
| 2003/0090951 A1 | 5/2003 | Yokozeki | |
| 2009/0154265 A1* | 6/2009 | Kim et al. | ................ 365/189.16 |

FOREIGN PATENT DOCUMENTS

| | | |
|---|---|---|
| JP | 01-241093 A | 9/1989 |
| JP | 2003-151280 A | 5/2003 |

* cited by examiner

*Primary Examiner* — Thong Q Le
(74) *Attorney, Agent, or Firm* — Arent Fox LLP

(57) ABSTRACT

A static RAM includes: a plurality of word lines; a plurality of pairs of local bit lines; a plurality of memory cells arranged in correspondence with intersections of the plurality of pairs of local bit lines and the plurality of word lines; a capacitance shared circuit arranged for each of the plurality of pairs of local bit lines; a common connection line connecting the plurality of capacitance shared circuits; and a pair of global bit lines connected to the plurality of pairs of local bit lines, wherein the capacitance shared circuit includes two N-channel transistors connected between the pair of local bit lines and the common connection line corresponding to each other.

5 Claims, 25 Drawing Sheets

FIG. 4
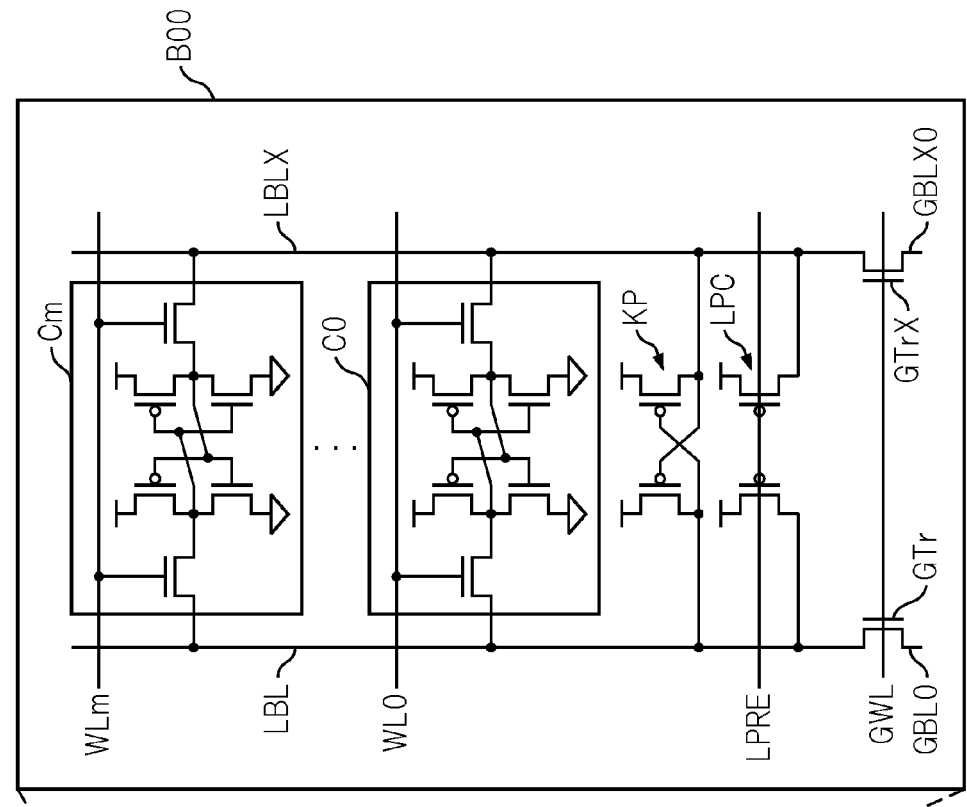
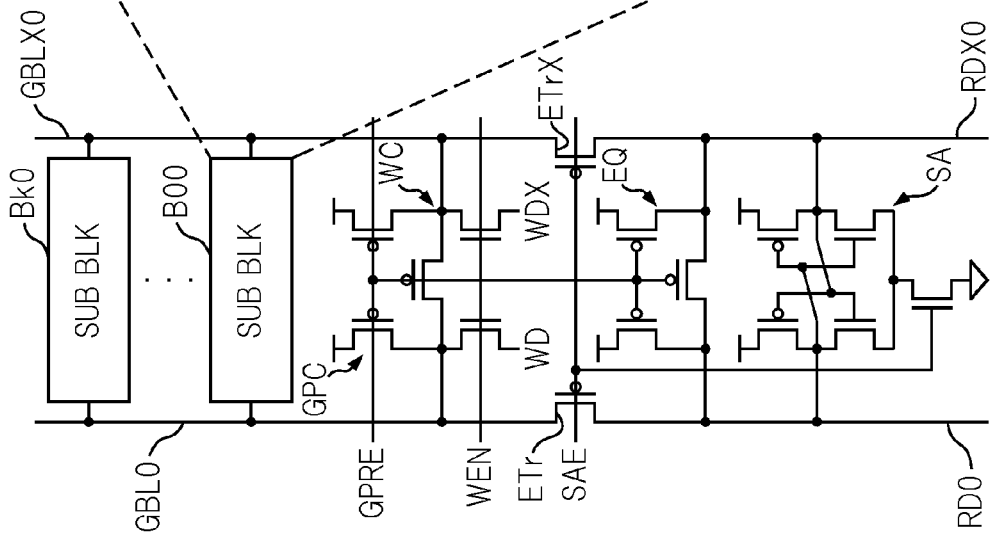

BL CAPACITANCE SHARED CIRCUIT

STATIC RAM

CROSS-REFERENCE TO RELATED APPLICATION

This application is based upon and claims the benefit of priority of the prior Japanese Patent Application No.2011-173764, filed on Aug. 9, 2011, the entire contents of which are incorporated herein by reference.

FIELD

The embodiments discussed herein are related to a static RAM (Random Access Memory).

BACKGROUND

A static RAM (SRAM) does not need to be refreshed like a DRAM (Dynamic Random Access Memory) and therefore operates at a high-speed and is used as a high-speed memory.

On the other hand, in recent years, a reduction in power consumption of a memory has been demanded. In order to realize a memory with lower power consumption, it is preferable to reduce the operating voltage. In a DRAM, if the operating voltage is reduced, the charge voltage of a capacitor provided in a memory cell is reduced, and therefore, it is preferable to perform the refresh operation frequently, and therefore, there is a problem that it is difficult to reduce power consumption. As a result, the power consumption is reduced by reducing the operating voltage of an SRAM.

A normal SRAM has a plurality of word lines and a plurality of pairs of bit lines arranged so as to be perpendicular to each other, a plurality of static memory cells arranged in correspondence to the intersections of the plurality of word lines and the plurality of pairs of bit lines, a plurality of column circuits arranged in correspondence to each pair of bit lines, a row decoder, a column decoder, a word line driver, and a plurality of column switches. Each column circuit has a sense amplifier, a precharge circuit, an equalizer, a keeper circuit, a pair of bit lines separation switch, etc.

FIG. 1 is a diagram illustrating a configuration of a portion corresponding to one pair of bit lines, i.e., one column of a general SRAM. Such a circuit is arranged in the number of sets of pairs of bit lines.

As illustrated in FIG. 1, the SRAM has a plurality (n+1) of word lines WL0 to WLn extending in parallel in the transverse direction, a pair of bit lines BL and BLX extending in parallel in the vertical direction, a plurality (n+1) of static memory cells C0 . . . Cn arranged in correspondence to the intersections of the plurality of word lines and the pair of bit lines, a pair of extended bit lines RD and RXD provided in correspondence to the pair of bit lines BL and BLX, transistors Tr and TrX forming a connection circuit of the pair of bit lines BL and BLX and the pair of extended bit lines RD and RDX, a precharge circuit PC and a keeper circuit KP connected between the pair of bit lines BL and BLX, and a sense amplifier SA and an equalizer EQ connected between the pair of extended bit lines RD and RDX.

Each memory is a well-known static memory cell having a flip-flop in which the inputs and outputs of two inverters are connected mutually and two transistors provided between two connection nodes of the flip-flop and the pair of bit lines BL and BLX. The gates of the two transistor are connected to the corresponding word line WL and when a row selection signal is applied to the word line, the transistor is brought into conduction (turned on) and a state is brought about where the memory cell is connected to the pair of bit lines BL and BLX.

The pair of bit lines BL and BLX is very long and to which a number (N+1) of the memory cells C0 . . . Cn are connected. The precharge circuit PC operates when a precharge signal PRE turns to "Low (L)" and precharges the pair of bit lines BL and BLX to "High (H)" level and does not operate when PRE is at H (off state). The keeper circuit KP maintains the bit line on the H side of the pair of bit lines BL and BLX at H. The transistors Tr and TrX are brought into conduction when a column signal COL is at L and brought into a cut-off state when the column signal COL is at H. The sense amplifier SA enters the operating state when a sense amplifier start signal SAE is at H and amplifies one of the pair of bit lines BL and BLX which is on the high voltage side to H and the other on the low voltage side to L and does not operate when SAE is at L (off state). The equalizer EQ has the same configuration as that of the precharge circuit PC and brings the pair of bit lines BL and BLX into the H state by short-circuiting them when an equalize signal EQD is at L and does not operate when the equalize signal EQD is at H (off state).

FIG. 2 is a time chart illustrating the read operation of the SRAM illustrated in FIG. 1. Here, WL0 represents a row selection signal to be applied to the word line WL0 in the zeroth row, BL/BLX represent voltages of the pair of bit lines BL and BLX, and RD/RDX represent voltages of the pair of extended bit lines RD and RDX, respectively.

As described above, to the pair of bit lines BL and BLX, a number (n+1) of memory cells are connected and to the word line WL of one the memory cells (in the zeroth row), the row selection signal (active at H) is applied, and thus, the two transistors are brought into conduction. In response to this, the voltage of one of the pair of bit lines BL and BLX drops in accordance with the stored data of the memory cell. At this time, the column signal COL is at L, the transistors Tr and TrX are in the conduction state, and therefore, the pair of extended bit lines RD and RDX also changes in the same way as that of the pair of bit lines BL and BLX.

On the other hand, the precharge signal PRE and the equalize signal EQD are at H and the precharge circuit PC and the equalizer EQ enter the off state. The sense amplifier start signal SAE is at L and the sense amplifier SA is in the off state.

When the voltage of one of the pair of bit lines BL and BLX and the pair of extended bit lines RD and RDX drops, the sense amplifier start signal SAE changes to H. At this time, the row selection signal, the precharge signal PRE, and the column signal COL change to H and the equalize signal EQD is maintained at H.

In response to this, the pair of bit lines BL and BLX and the pair of extended bit lines RD and RDX are cut off and the voltage of the pair of bit lines BL and BLX changes to H by the precharge circuit PC. Because the row selection signal changes to L, the memory cell C0 is cut off from the pair of bit lines BL and BLX and maintains a state corresponding to the stored data.

The sense amplifier SA amplifies so that one of the pair of extended bit lines RD and RDX which is on the low voltage side changes to L or is maintained at L and the other on the high voltage side changes to H or is maintained at H. The changed state of the pair of extended bit lines RD and RDX is notified to the output circuit via the column switch. When the output of the state of the pair of extended bit lines RD and RDX to the outside is completed, the sense amplifier start signal SAE changes to L and the sense amplifier SA enters the off state, and the equalize signal EQD changes to L and the equalizer EQ changes the pair of extended bit lines RD and RDX to H.

In the way described above, both the pair of bit lines BL and BLX and the pair of extended bit lines RD and RDX turn to H and a state is brought about where the next read is performed.

The above is the read operation of a general SRAM.

The characteristics of transistors forming memory cells vary in the manufacturing process. By the variations of the characteristics of N-channel transistors of two inverters, the amount of amplitude on the side of the pair of bit lines BL and BLX which changes to L differs considerably. In other words, the speed of the change to L of one of the pair of bit lines BL and BLX differs.

In BL/BLX in FIG. 2, a illustrates the change when the N-channel transistor has favorable characteristics, b illustrates the change when the N-channel transistor has average characteristics, and c illustrates the change when the N-channel transistor has poor characteristics, respectively. Further, in RD/RDX in FIG. 2, d illustrates the change when the N-channel transistor has favorable characteristics, e illustrates the change when the N-channel transistor has average characteristics, and f illustrates the change when the N-channel transistor has poor characteristics, respectively.

In order for the sense amplifier SA to correctly amplify the voltage to L on the side where the voltage of one of the pair of extended bit lines RD and RDX has dropped, it is preferably for the voltage difference between the pair of extended bit lines RD and RDX to be a predetermined amount or more. In the other words, the voltage of the other of the pair of extended bit lines RD and RDX is at H, and therefore, it is preferably for the lower voltage to be a predetermined value or less. There arises no problem when the characteristics of the N-channel transistor are favorable, however, when the characteristics of the N-channel transistor are poor, the sense amplifier start signal SAE does not change to H until the voltage of one of the pair of extended bit lines RD and RDX drops to the predetermined value or less. As a result, the time that the voltage of one of the pair of extended bit lines RD and RDX drops to the predetermined value or less determines the read speed.

As described above, in order to reduce power consumption, the operating voltage is reduced, and therefore, the reduction in read speed appears more remarkably as the operating voltage is reduced. Because of this, it is difficult to sufficiently reduce the operating voltage while maintaining a predetermined operating speed.

Further, in the SRAM, it is preferable to correctly read data stored in all the memory cells and it is preferable to set the read speed in accordance with the memory cell the slowest in operation. If such a read speed is set, when reading data from the memory cell having the transistor with average or favorable characteristics, the transistor of the memory cell changes the voltage of one of the pair of bit lines BL and BLX considerably as a result, i.e., in other words, the amount of amplitude becomes large and power consumption is increased.

RELATED DOCUMENTS

[Patent Document 1] Japanese Laid Open Patent Document No. 2003-151280
[Patent Document 2] Japanese Laid Open Patent Document No. E01-241093

SUMMARY

According to an aspect of the embodiments, a static RAM includes: a plurality of word lines; a plurality of pairs of local bit lines; a plurality of memory cells arranged in correspondence with intersections of the plurality of pairs of local bit lines and the plurality of word lines; a capacitance shared circuit arranged for each of the plurality of pairs of local bit lines; a common connection line connecting the plurality of capacitance shared circuits; and a pair of global bit lines connected to the plurality of pairs of local bit lines, wherein the capacitance shared circuit includes two N-channel transistors connected between the pair of local bit lines and the common connection line corresponding to each other.

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF THE DRAWINGS

FIG. 4 is a diagram illustrating details of the sub blocks, the pair of global bit lines, the column circuit, and the pair of extended global bit lines in the first row of the basic SRAM;

DESCRIPTION OF EMBODIMENTS

First, a basic SRAM is explained.

Figure 3:
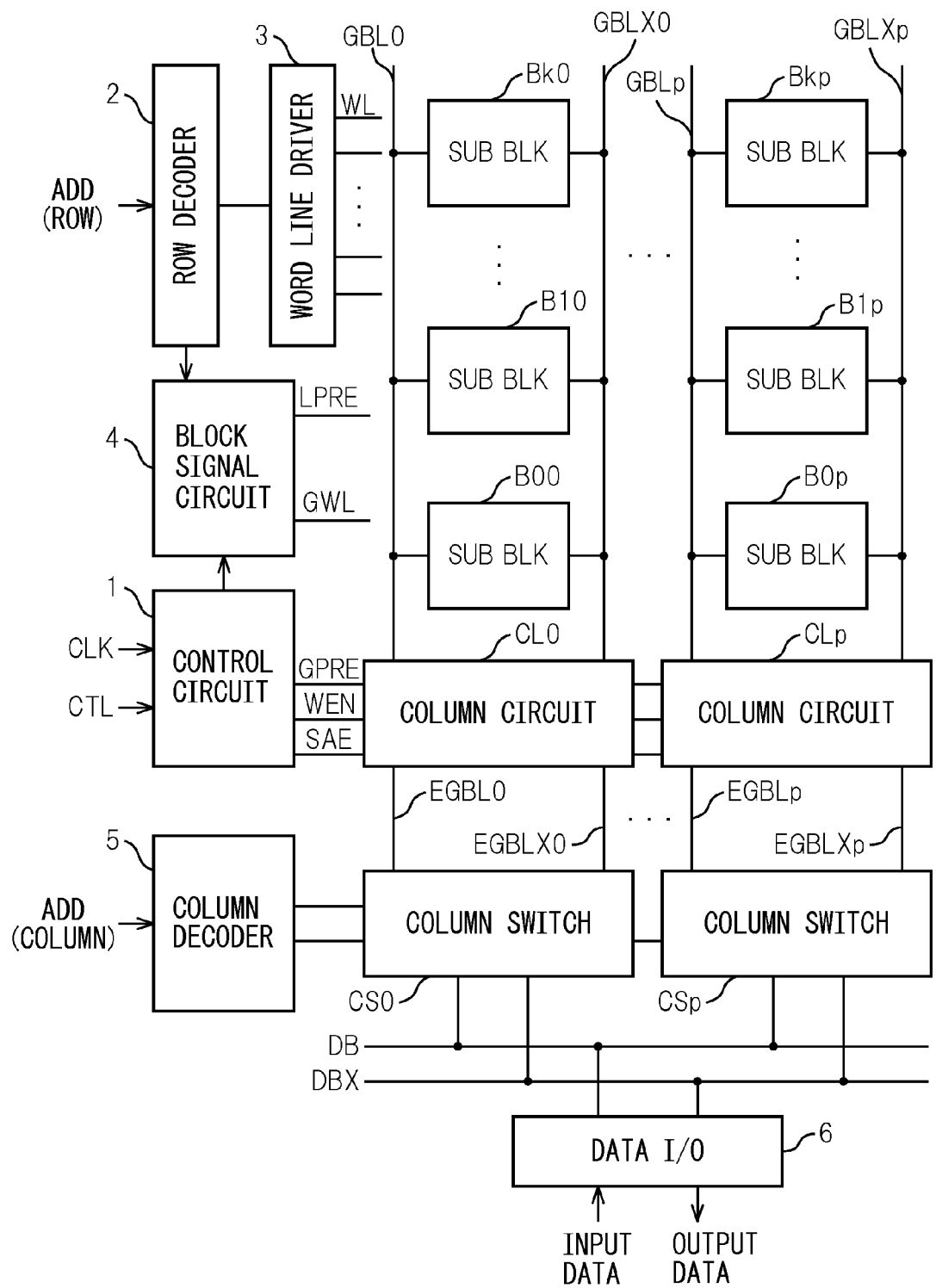
FIG. 3 is a diagram illustrating a general configuration of a basic SRAM.

FIG. 3 is a diagram illustrating a general configuration of a basic SRAM.

A basic SRAM has a control circuit 1, a row decoder 2, a word line driver 3, a block signal circuit 4, a column decoder 5, a plurality of column switches CS0 to SCp, a data I/O circuit 6, a plurality ((k+1)×(m+1)) of word lines WL, a plurality (p+1) of pairs of global bit lines GBL0 and GBLX0 to GBLp and GBLXp, a plurality (p+1) of pairs of extended global bit lines EGBL0 and EGBLX0 to EGBLp and EGBLXp, a plurality ((k+1)×(p+1)) of sub blocks (SUB BLK) B00 to Bkp arranged in correspondence to the plurality of word lines, and a plurality of column circuits CL0 to CLp provided in correspondence to each pair of bit lines. As described above, the SRAM of the embodiment has a hierarchical structure in which a plurality of pairs of short local bit lines is connected to the pair of long global bit lines.

The control circuit 1 generates an operation control signal supplied to each part within the SRAM based on a clock CLK and a control signal CTL supplied from outside. The control signal CTL includes, for example, a read signal RE, a write signal WE, etc. The operation control signal includes a write enable signal WEN, the sense amplifier start signal SAE, a global precharge signal GPRE, an internal clock, etc. The operation control signal is supplied also to the row decoder 2, the column decoder 5, the block signal circuit 4, etc. The row decoder 2 receives a row address part of an address signal in synchronization with the clock CLK and supplies a word line selection signal to the word line driver 3. The row decoder 2 further supplies a signal obtained by decoding the row address part of the address signal to the block signal circuit 4.

The word line driver 3 applies a row selection signal (active at H) to the word line corresponding to the word line selection signal. The block signal circuit 4 outputs a local precharge signal LPRE and a global connection signal GWL to the sub block to which the word line to which the row selection signal is applied is connected. The column decoder 5 receives a column address part of the address signal in synchronization with the clock CLK and supplies a column selection signal to the column switch CS0 to CSp. The data I/O circuit 6 receives input data to be written from outside and outputs the read output data to outside. The column switch selected by the column selection signal supplies input data from the data I/O circuit 6 to the column circuit at the time of write and supplies data read from the column circuit to the data I/O circuit at the time of read. The basic SRAM performs the same operation as the normal write operation at the time of write, and therefore, only the read operation is explained below.

FIG. 4 is a diagram illustrating details of the sub blocks B00 to Bk0, the pair of global bit lines GBL0 and GBLX0, the column circuit CL0, and the pair of extended global bit lines EGBL0 and EGBLX0 in the first row of the basic SRAM. The circuit as illustrated in FIG. 4 is provided for each column, i.e., for each pair of global bit lines.

Between the pair of global bit lines GBL0 and GBLX0, a plurality (k+1) of sub blocks (SUB BLK) B00 to Bk0 is connected. Each sub block has the same configuration.

The sub block B00 has a pair of local bit lines LBL and LBLX provided in parallel, a plurality (m+1) of memory cells C0 to Cm connected between the pair of local bit lines, a local precharge circuit LPC and the keeper circuit KP connected between the pair of local bit lines, and global connection transistors GTr and GTrX that form a connection circuit of the pair of local bit lines LBL and LBLX and the pair of global bit lines GBL0 and GBLX0.

Each memory cell is a publicly-known static memory cell having a flip-flop in which the inputs and outputs of two inverters are connected mutually and two transistors provided between the two connection nodes of the flip-flop and the pair of local bit lines LBL and LBLX. The gates of the two transistors are connected to the corresponding word line WL and brought into conduction (turned on) when the row selection signal is applied to the word line and the state is brought about where the memory cell is connected to the pair of local bit lines LBL and LBLX.

The local precharge circuit LPC operates when the local precharge signal LPRE turns to L and precharges the pair of local bit lines LBL and LBLX to H and does not operate when LPRE is at H (off state). The keeper circuit KP maintains the bit line on the H side of the pair of bit lines BL and BLX at H. The global connection transistors GTr and GTrX are brought into conduction when the global selection signal GWL output from the block signal circuit 4 is at H and enters the cut-off state when the global selection signal GWL is at L.

The column circuit CL0 has a global precharge circuit GPC, a write circuit WC, extended connection transistors ETr and ETrX, the equalizer EQ, and the sense amplifier SA.

The global precharge circuit GPC is connected between the pair of global bit lines GBL0 and GBLX0 and operates when the global precharge signal GPRE turns to L and precharges the pair of global bit lines GBL0 and GBLX0 to H and does not operate when GPRE is at H.

The write circuit WC operates when the write enable signal WEN output from the control circuit 1 is at H, sets WD and WDX to H and L or to L and H in accordance with the write data, and brings the pair of global bit lines GBL0 and GBLX0 into a state in accordance with the write data. The pair of local bit lines LBL and LBLX changes to a state corresponding to the state of the pair of global bit lines GBL0 and GBLX0 via the global connection transistors GTr and GTrX. Then, the memory cell of target of write is connected to the pair of local bit lines LBL and LBLX and enters a state in accordance with the write data. The write operation of the present embodiment is the same as that of a general SRAM in which the pair of bit lines is formed into a hierarchical structure, and therefore, further explanation is omitted.

The extended connection transistors ETr and ETrX form a connection circuit of the pair of global bit lines GBL0 and GBLX0 and a pair of extended bit lines RD0 and RDX0 provided in correspondence to the pair of global bit lines GBL0 and GBLX0. The extended connection transistors ETr and ETrX are brought into conduction (turned on) when the sense amplifier start signal SAE output from the control circuit 1 is at L and is cut off (turned off) when the sense amplifier start signal SAE is at H.

The sense amplifier SA enters the operating state when the sense amplifier start signal SAE output from the control circuit 1 is at H and amplifies the high voltage side of the pair of extended bit lines RD0 and RDX0 to H and the low voltage side to L and does not operate when SAE is at L (off state). The equalizer EQ short-circuits and brings the pair of bit lines BL and BLX into the H state when the global precharge signal GPRE is at L and does not operate when the equalize signal EQD is at H (off state.

Figure 5:
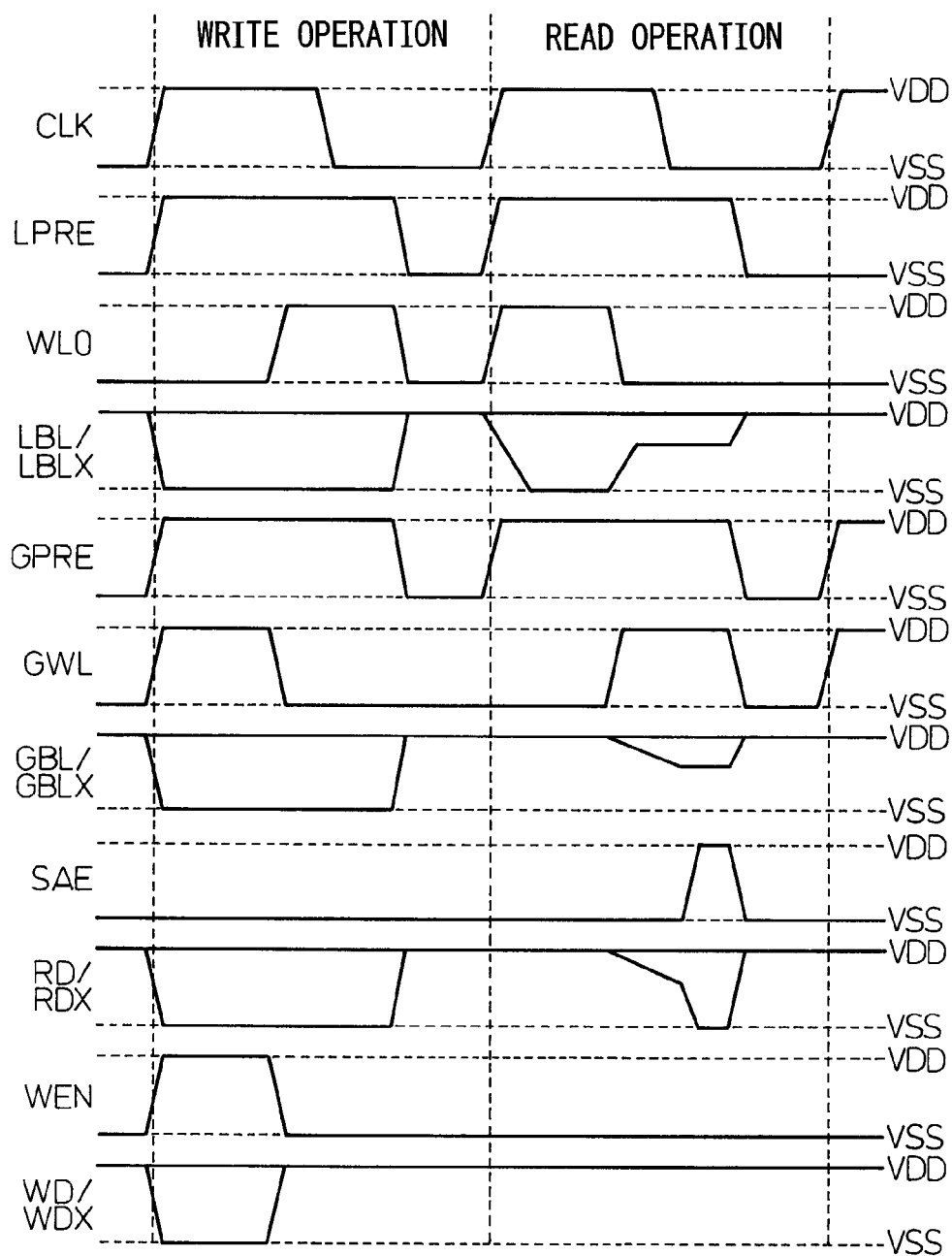
FIG. 5 is a time chart illustrating the operation of the basic SRAM.

FIG. 5 is a time chart illustrating the operation of the basic SRAM. The operation is performed in synchronization with the clock CLK. First, the read operation is explained and during the read operation, the write circuit WC is in the off state, and therefore, the operation of the write circuit WC is not explained. A case is explained where the memory cell C0 is accessed and stored data is read, however, the reverse case is also the same. It is assumed that the memory cell C0 is in a state where the node thereof connected to the local bit line LBL is at L (VSS) and the node connected to LBLX is at H (VDD).

Before CLK rises, LBL, LBLX, GBL0, GBLX0, RD0, and RDX0 are reset to H.

In synchronization with the rise of CLK, LPRE and GPRE change to H and at the same time, the row selection signal is applied to the word line WL0 and WL0 changes to H. At this time, GWL, SAE, and WEN are at L. Because LPRE and GPRE turn to H, the local precharge circuit LPC, the global precharge circuit GPC, and the equalizer EQ enter the off state. Because GWL is at L, GTr and GTrX are in the off state. Further, because SAE is at L, the sense amplifier SA is in the off state and ETr and ETrX are in the conduction state.

Because WL0 changes to H, the connection transistor of the memory cell C0 is brought into conduction and the node in the L state is connected to LBL and the node in the H state to LBLX. Because the N-channel transistor of the memory cell C0 connected to LBL is brought into conduction, LBL changes to L (VSS). After that, the application of the row selection signal is stopped and in synchronization with WL0 turning to L, GWL changes to H. In response to this, the local bit line LBL in the L state, the global bit line GBL0 and the extended global bit line RD0 in the H state are connected, a charge share occurs, and voltages of the global bit line GBL0 and the extended global bit line RD0 drop by an amount corresponding to a capacitance ratio to the local bit line. At the same time as this, the voltage of the local bit line LBL increases by the charge share. The local bit line LBLX, the global bit line GBLX0, and the extended global bit line RDX0 are all at H, and therefore, they do not change.

After the voltages of the global bit line GBL0 and the extended global bit line RD0 drop, the sense amplifier start signal SAE changes to H. Due to this, the pair of extended global bit lines RD0 and RDX0 is cut off from the pair of global bit lines GBL0 and GBLX0. The pair of local bit lines LBL and LBLX and the pair of global bit lines GBL0 and GBLX0 maintain the connected state. Consequently, the pair of local bit lines LBL and LBLX and the pair of global bit lines GBL0 and GBLX0 maintain the voltage at that point of time.

Because the sense amplifier start signal SAE changes to H, the sense amplifier SA operates and changes the voltage of the extended global bit line RD0 to L. The voltage of the extended global bit line RDX0 is maintained at H. The column switch CS0 outputs the sate of the pair of extended global bit lines RD0 and RDX0 from the data I/O 6 via the buses DB and DBX.

After that, the sense amplifier start signal SAE changes to L and at the same time as that, LPRE and GPRE change to L. In response to this, the sense amplifier enters the off state and LPC, GPC, and EQ initialize the pair of local bit lines LBL and LBLX, the pair of global bit lines GBL0 and GBLX0, and the pair of extended global bit lines RD0 and RDX0 to H. In this manner, a state where read operation is performed is brought about.

In FIG. 5, the write operation is also illustrated, however, the operation at the time of write is the same as the write operation of the SRAM with a normal hierarchical bit line structure, and therefore, explanation thereof is omitted.

In the basic SRAM, as to the amount of change in voltage accompanying the read of the pair of global bit lines GBL0 and GBLX0 and the pair of extended global bit lines RD0 and RDX0, the amount of amplitude is determined by the capacitance ratio between the pair of local bit lines LBL and LBLX. The capacitance of the pair of local bit lines BL and BLX is comparatively small. Therefore, even if there are variations in the characteristics of the N-channel transistor of the memory cell, it is possible to change the pair of local bit lines LBL and LBLX to L in a brief time, and therefore, there is no influence of the variations in the characteristics of the N-channel transistor of the memory cell. Consequently, it is possible to suppress the amount of amplitude of the bit line and to reduce power.

The effect obtained from the basic SRAM is further explained in detail. First, the power reduction effect is explained.

When a hierarchical bit line structure is used as in the basic SRAM, normally, the sum of the precharge/discharge power of the pair of local bit lines LBL and LBLX and that of the pair of global bit lines GBL0 and GBLX0 and the pair of extended global bit lines RD0 and RDX0 is equal to power for reading one bit of the SRAM.

However, in the basic SRAM, it is possible to eliminate the precharge/discharge power of the pair of global bit lines GBL0 and GBLX0 and the pair of extended global bit lines RD0 and RDX0. This is explained with reference to the time chart in FIG. 6.

Figure 6:
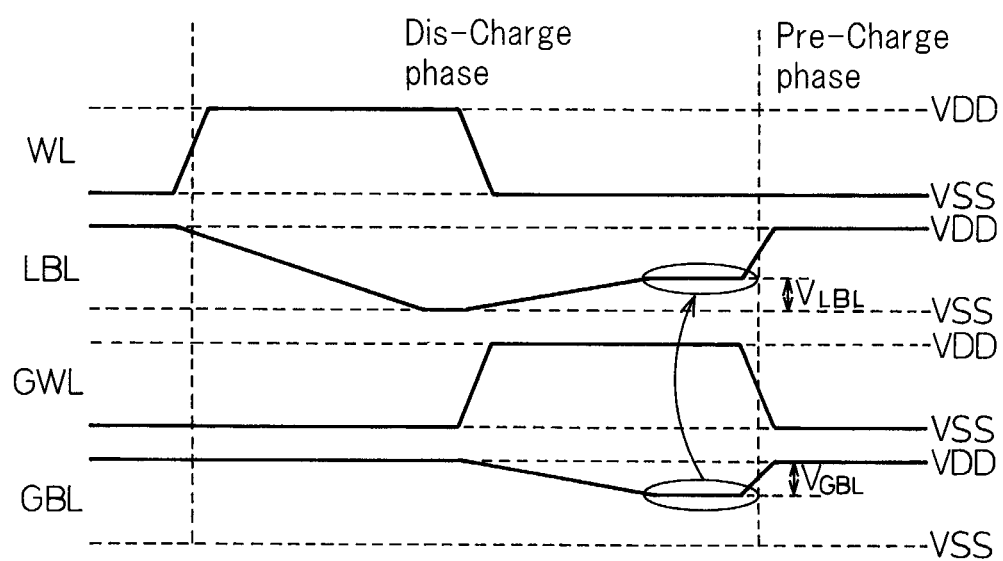
FIG. 6 is an enlarged view of part of the time chart in FIG. 5.

FIG. 6 is an enlarged view of part of the time chart in FIG. 5. A phase in which the pair of global bit lines GBL0 and GBLX0 is brought into a state in correspondence to the data stored in the memory cell is a discharge phase (Dis-Charge phase) and a phase in which the pair of global bit lines GBL0 and GBLX0 is brought into the H state is a precharge phase (Pre-Charge phase).

In the basic SRAM, the voltage of one of the local bit lines LBL and LBLX is reduced down to L (VSS) by applying the row selection signal to the word line to bring the connection transistor of the memory cell into conduction. After that, the application of the row selection signal is stopped to cut off the connection transistor and one of the local bit lines LBL and LBLX is brought into the floating state at L. After that, GWL is turned to H to bring GTr and GTrX into conduction, a charge share is caused to occur between the pair of local bit lines LBL and LBLX, the pair of global bit lines GBL0 and GBLX0, and the pair of extended global bit lines RD0 and RDX0, and the voltages of the pair of global bit lines GBL0 and GBLX0 and the pair of extended global bit lines RD0 and RDX0 are amplified. The change in voltage at this time only moves part of charges (corresponding to $V_{GBL}$) remaining in the pair of global bit lines GBL0 and GBLX0 and the pair of extended global bit lines RD0 and RDX0 to the local bit lines LBL and LBLX, and therefore, power is not consumed. At this time, the voltage of the pair of local bit lines LBL and LBLX is raised by an amount corresponding to $V_{LBL}$. FIG. 6 illustrates that the charges of GBL have moved to LBL.

As described above, in the precharge phase (Pre-Charge phase) after performing the operation in the discharge phase (Dis-Charge phase), the pair of local bit lines LBL and LBLX, the pair of global bit lines GBL0 and GBLX0, and the pair of extended global bit lines RD0 and RDX0 are precharged to H (VDD). The amount of charge at this time of the local bit line LBL is VDD-$V_{LBL}$ and that of the global bit line GBL and the extended global bit line RD0 is $V_{GBL}$. The amount of charge at the time of precharge is the same as that when the local bit line LBL is charged from VSS to VDD. Consequently, during both the discharge phase (Dis-Charge phase) and the precharge phase (Pre-Charge phase), the global bit line GBL does not consume power.

Figure 1:
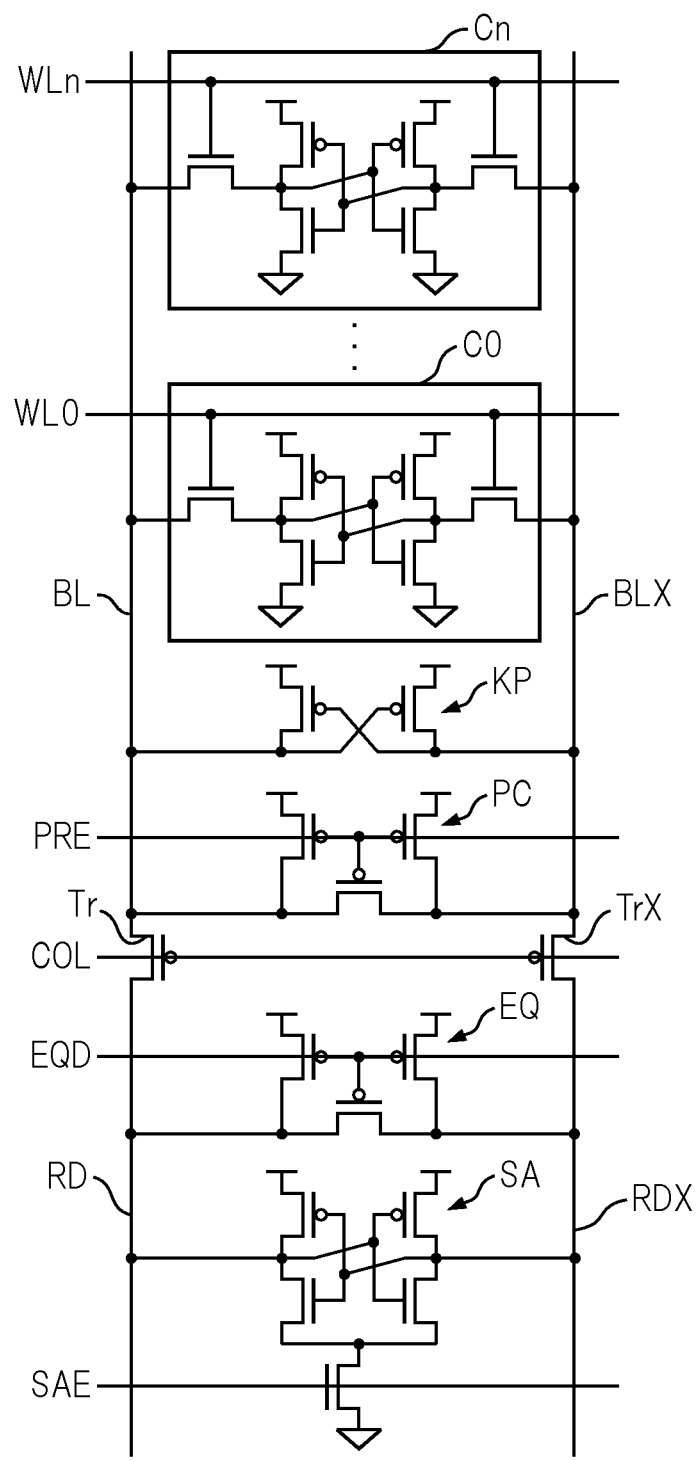
FIG. 1 is a diagram illustrating a configuration of a portion corresponding to one pair of bit lines, that is, one column of a general SRAM.
Figure 2:
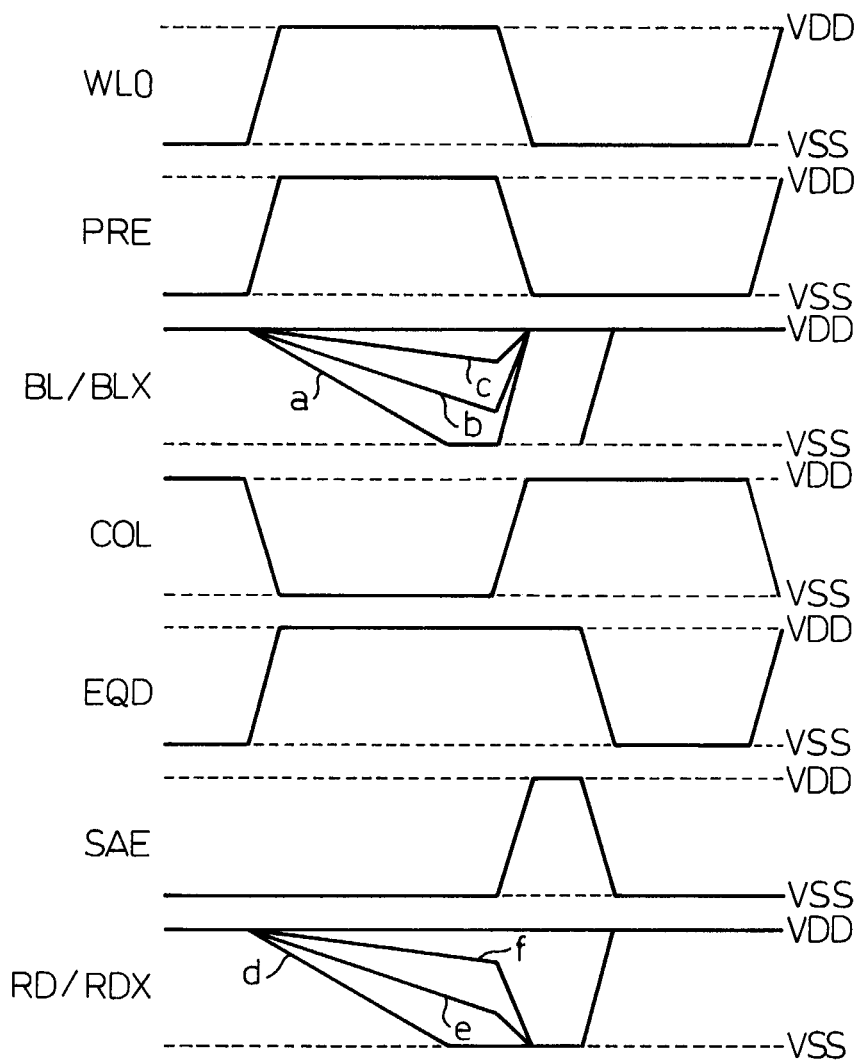
FIG. 2 is a time chart illustrating the read operation of the SRAM illustrated in FIG. 1.

Next, the power reduction effect of the SRAM having the general circuit configuration illustrated in FIG. 1 and the basic SRAM is explained.

The power consumption is expressed by Equation P=CV². If the capacitance of the pair of bit lines corresponding to one cell of the memory cell is taken to be $C_{BL}$, the capacitance of the pair of bit lines BL is the number of rows×the number of columns×$C_{BL}$. When the average amount of amplitude of bit line=VDD/2, the number of rows=128, and the number of columns=4 at the time of read, the power consumption at the time of read corresponding to one bit of the SRAM in FIG. 1 is as follows.

Power consumption at the time of read of the circuit in FIG. 1=4×128×$C_{BL}$×0.5×VDD²=256×$C_{BL}$×VDD²

Next, power consumption at the time of read corresponding to one bit of the basic SRAM is explained.

As described previously, in the basic SRAM, the pair of global bit lines GBL0 and GBLX0 does not consume power, and therefore, it is preferable to take into consideration only the power in the pair of local bit lines LBL and LBLX. If k=8 and m=16 in FIG. 4, the power consumption when the number of rows=16 and the number of columns=4 of the local bit line is as follows.

Power consumption at the time of read in the basic SRAM=4×16×$C_{BL}$×VDD²=64×$C_{BL}$×VDD²

Consequently, in the basic SRAM, it is possible to reduce the power consumption at the time of read to ¼ compared to that of the general SRAM in FIG. 1.

Figure 7A:
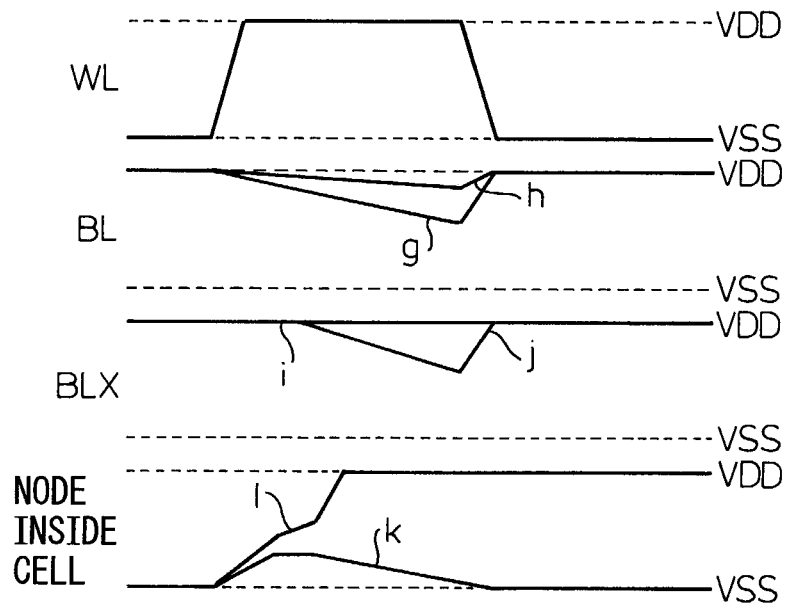
FIG. 7A illustrates the case of the general SRAM illustrated in FIG. 1.
Figure 7B:
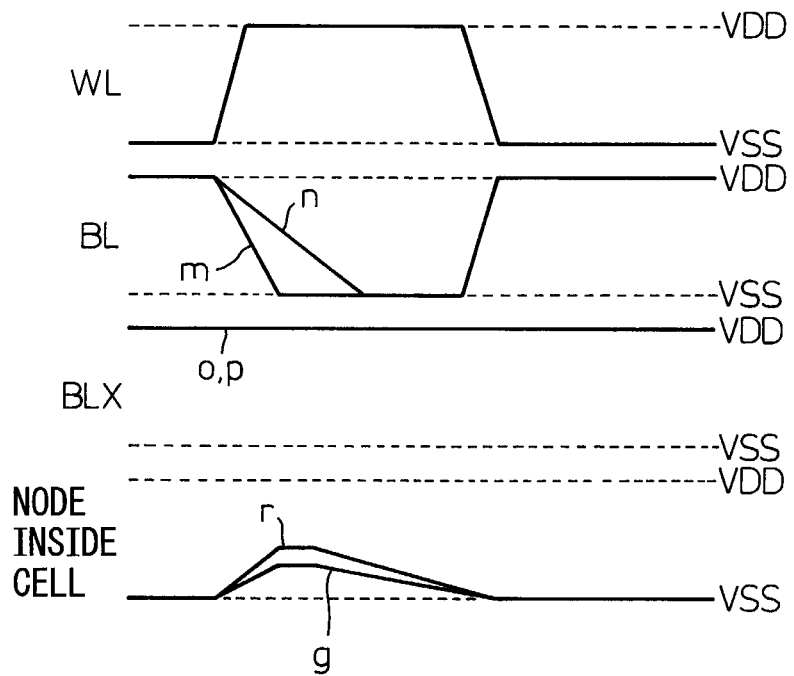
FIG. 7B illustrates the case of the basic SRAM.

Next, the improvement effect of poor stability is explained with reference to FIG. 7A and FIG. 7B. FIG. 7A illustrates the case of the general SRAM illustrated in FIG. 1 and FIG. 7B illustrates the case of the basic SRAM. In FIG. 7A, g and k illustrate the case where the characteristics of the transistor of the memory cell are normal and h and l illustrate the case where the characteristics of the transistor of the memory cell are poor. In FIG. 7B, m and q illustrate the case where the characteristics of the transistor of the memory cell are normal and n and r illustrate the case where the characteristics of the transistor of the memory cell are poor.

As illustrated in FIG. 7A, in the case of the general SRAM, the capacitance of the bit line BL is large, in other words, a number of memory cells are connected to BL, and therefore, the voltage of the bit line BL drops only gradually. Therefore, when data is read from the memory cell the characteristic of which are poor, the voltage of the bit line BL does not drop sufficiently and in the state near VDD. The advanced processes applied to the manufacturing of the SRAM, etc., have large random variations, and therefore, depending on a certain balance of the six transistors within the memory cell, there is a case where the value of the cell is inverted and erroneous read results.

In contrast to this, in the basic SRAM, as illustrated in FIG. 7B, the voltage of the bit line BL drops down to VSS before the value of the memory cell is inverted, and therefore, erroneous read is prevented. The reason is that the number of memory cells connected to the bit line BL is small and the wire length is short, and therefore, the capacitance is small. Because the bit line BL drops down to VSS before inversion, data L is written back to the memory cell as a result, and therefore, the poor stability is suppressed and reliability is improved.

In the explanation given above, it is assumed that the column circuits provided in correspondence to the plurality of the pairs of global bit lines operate at the same time, however, it is also possible to operate the column circuits in the column to which the memory cell to be accessed belongs.

As explained above, when the read operation is performed by utilizing the charge share between the local bit line and the global bit line, only part of charges accumulated between the global bit line and the local bit line are moved, and therefore, no power is consumed. Further, the global bit line does not consume power during the period of both the discharge phase (Dis-Charge phase) and the precharge phase (Pre-Charge phase).

Consequently, in order to further reduce power consumption, it is desirable to shorten the pair of local bit lines and lengthen the global bit line. However, the amount of amplitude of the global bit line is determined by the capacitance ratio between the local bit line and the global bit line, and therefore, when the local bit line is shortened, the global bit line also needs to be shortened. The reason is that it is preferable to secure the minimum potential difference between the bit lines so as to operate the sense amplifier. When the global bit line is shortened, it is preferable to provide a large number of circuits, such as the sense amplifier and the write circuit (write driver), and therefore, the macro size is increased and the reduction effect of power consumption is lessened as a result. Further, it is difficult to design a large capacity SRAM.

The SRAM of the embodiment explained below solves this problem.

An SRAM of a first embodiment has a general configuration similar to that of the basic SRAM illustrated in FIG. 3.

Figure 8:
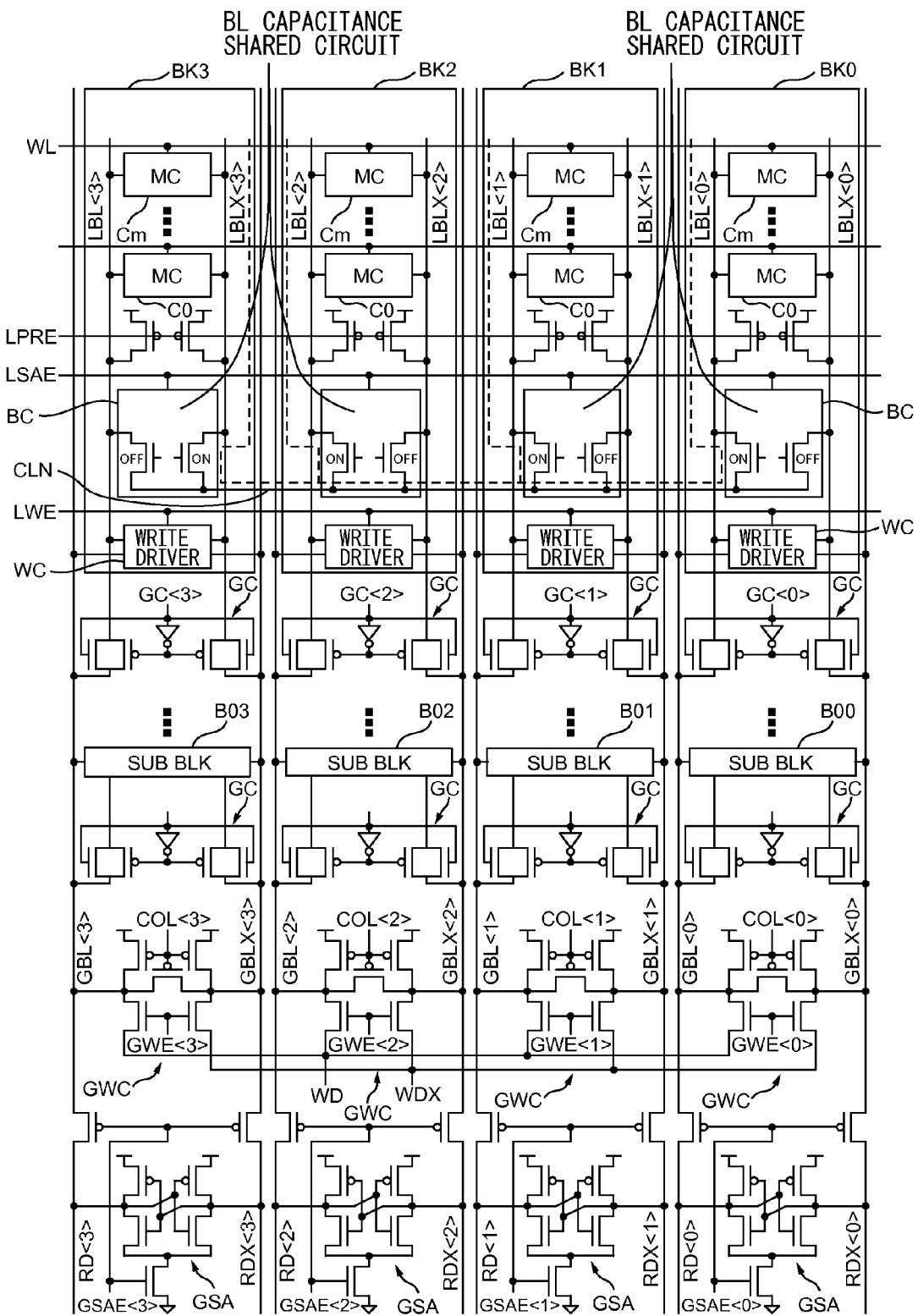
FIG. 8 is a diagram illustrating a configuration of a memory cell matrix of the SRAM of the first embodiment.

FIG. 8 is a diagram illustrating a configuration of a memory cell matrix of the SRAM of the first embodiment. FIG. 8 illustrates four columns of the circuit corresponding to one column illustrated in FIG. 4. In actuality, a number of such columns are provided.

Each column has pairs of global bit lines GBL<0>/GBLX<0> to GBL<3>/GBLX<3> and pairs of extended bit lines RD<0>/RDX<0> to RD<3>/RDX<3>. The pair of global bit lines and the pair of extended bit lines corresponding to each other are connected via extended connection transistors, respectively.

Between the pair of global bit lines GBL<3> and GBLX<3>, a plurality (k+1) of sub blocks (SUB BLK) B03 to Bk3 is connected and in other columns, a plurality of sub blocks is connected similarly. Further, in correspondence to each sub block, a global connection circuit GC including global connection transistors is provided. While the global connection transistor is illustrated schematically so as to be provided within the sub block in FIG. 4, here, it is illustrated schematically so as to be provided outside the sub block, however, there is no substantial difference.

Further, between the pair of global bit lines GBL<3> and GBLX<3>, one global write circuit GWC is connected and in other columns, one global write circuit GWC is connected similarly. Furthermore, between the pair of extended bit lines RD<3> and RDX<3>, one global sense amplifier GSA is connected and in other columns, one global sense amplifier GSA is connected similarly.

For example, the sub block Bk3 has a pair of local bit lines LBL<3> and LBLX<3> provided in parallel, a plurality (m+1) of memory cells C0 to Cm connected between the pair of local bit lines, a local precharge circuit connected between the pair of local bit lines, a bit line (BL) capacitance shared circuit BC, and a write circuit (write driver) WC. As in FIG. 4, it may also be possible to provide a keeper circuit. Other sub blocks also have the same configuration.

The BL capacitance shared circuit BC has two N-channel transistors and the drains of the two N-channel transistors are connected to the local bit line LBL<3> or LBLX<3> and the sources thereof are connected to a common connection line CLN. The common connection line CLN is connected in a shared manner to the source of the N-channel transistor of the BL capacitance shared circuit BC of the sub block corresponding to the four columns. However, the common connection line CLN may be connected to the source of the N-channel transistor of the BL capacitance shared circuit BC of the columns in the number other than four.

Figure 9:
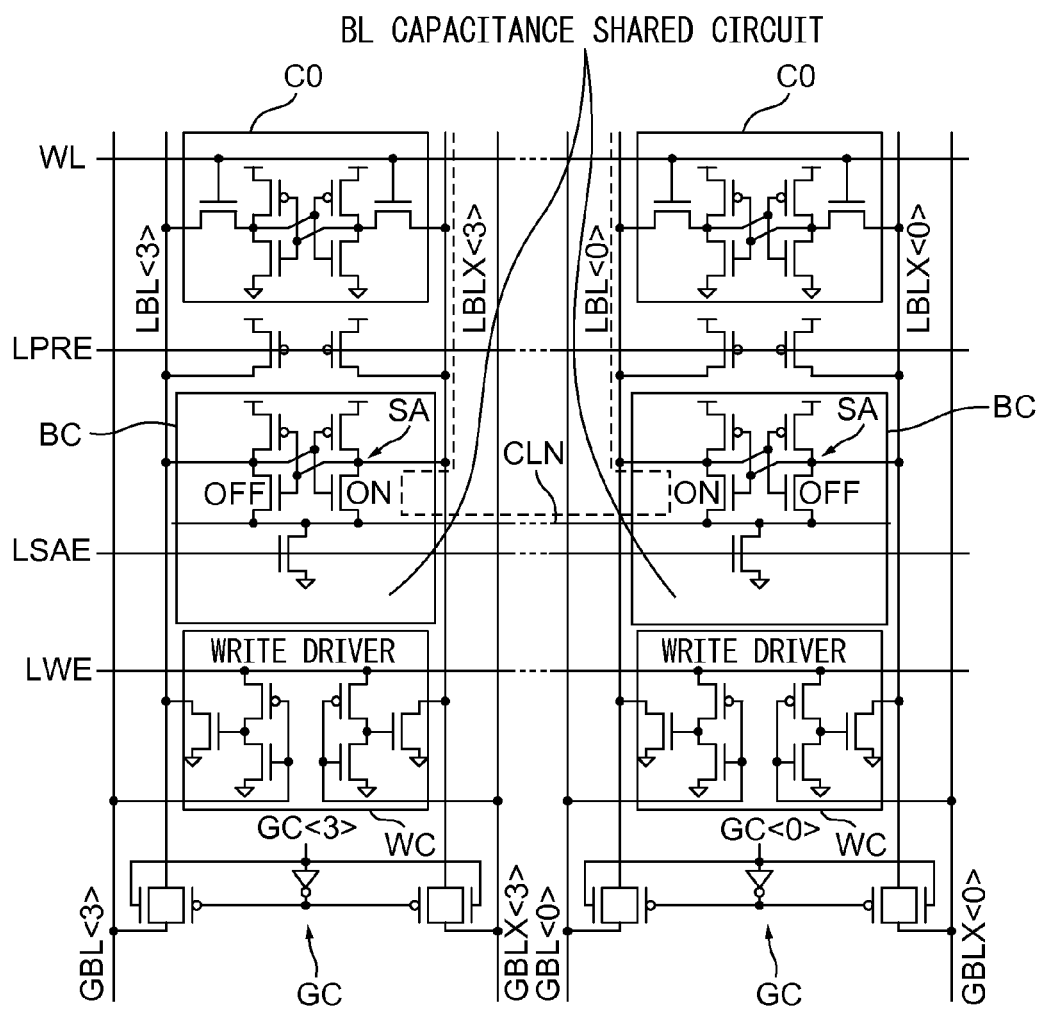
FIG. 9 is a diagram illustrating in detail one memory cell, the precharge circuit, the BL capacitance shared circuit, the write driver, and the global connection circuit as to a column <0> and a column <3> on both sides illustrated in FIG. 8.

FIG. 9 is a diagram illustrating in detail one memory cell C0, the precharge circuit, the BL capacitance shared circuit BC, the write driver WC, and the global connection circuit GC as to a column <0> and a column <3> on both sides illustrated in FIG. 8.

The memory cell C0 has the same circuit configuration as that of the memory cell illustrated in FIG. 1 and is a normal static memory cell formed by six MOS transistors. The precharge circuit and the write driver WC have configurations somewhat different from those in the example illustrated in FIG. 4, however, have similar functions and are widely-known circuits, and therefore, explanation is omitted.

The global connection circuit GC has a transfer gate connected between the pair of local bit lines and the pair of global bit lines. The transfer gate is controlled by a connection signal. For example, between the pair of local bit lines LBL<3> and LBLX<3> and the pair of global bit lines GBL<3> and GBLX<3>, the transfer gate is provided and the connection state is controlled by a connection signal GC<3>. The transfer gate of the global connection circuit GC of other columns is the same and the connection signal of each column is independent and it is possible to control the transfer gate of each column independently of another. In FIG. 8 and FIG. 9, the transfer gate having the N-channel transistor and the P-channel transistor is used, however, it is also possible to use only the N-channel transistor or the P-channel transistor in place of the transfer gate.

The BL capacitance shared circuit BC has the same configuration as that of the sense amplifier illustrated in FIG. 1 and FIG. 4 and the sources of the two N-channel transistors are connected to the common connection line CLN and the operating state is controlled by a local sense amplifier start signal LSAE.

As explained above, the SRAM of the first embodiment resembles the basic SRAM in the fundamental configuration. However, the SRAM of the first embodiment differs from the basic SRAM in that the common connection line CLN is provided and the source of the N-channel transistor of the sense amplifier SA provided within the BL capacitance shared circuit BC of each sub block is connected to the common connection line CLN.

Figure 10:
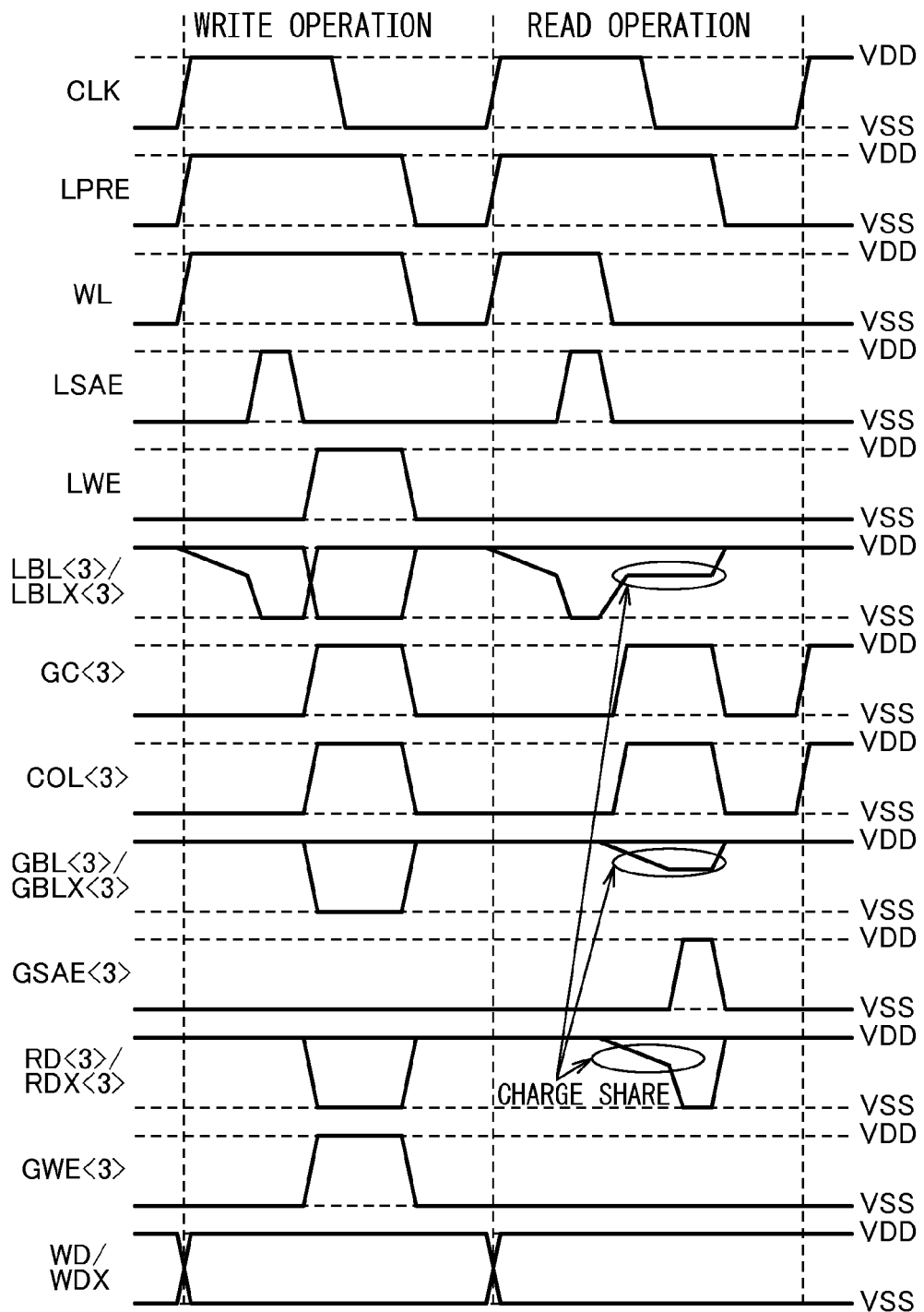
FIG. 10 is a time chart illustrating the operation of the SRAM of the first embodiment.

FIG. 10 is a time chart illustrating the operation of the SRAM of the first embodiment. In FIG. 10, a case is explained as an example, where the column <3> on the left side in FIG. 9 is selected and the write operation and the read operation are performed. The operation is performed in synchronization with the clock CLK.

When the read operation starts, LSAE, GC<3>, COL<3>, GSAE<3>, and GWE<3> are at L (Low). LWE and GWE are maintained at L during the read operation regardless of the column. GC, COL, and GSAE of other columns are maintained at L during the read operation. Due to this, the pair of local bit lines LBL<3>/LBLX<3>, the pair of global bit lines GBL<3>/GBLX<3>, and the pair of extended global bit lines RD<3>/RDX<3> are in the state of having been charged to VDD (H : High), respectively. GBL<3>/GBLX<3> are in the state of being connected to RD<3>/RDX<3>.

In synchronization with the rise of CLK, the local precharge signal LPRE changes to VDD and the row selection signal WL changes to H and the write data WD/WDX is set. When LPRE turns to L, PC turns off and LBL<3> and LBLX<3> enter the separated state. When any WL within the sub block turns to H, the state of the memory cell where WL of each column has turned to H is read by the pair of local bit lines and the potential of the pair of local bit lines of each column changes, and further, LSAE changes to H and enlarges the potential difference at that time and turns one to H and the other to VSS (L : Low).

At this time, in the present embodiment, one of the N-channel transistors of the sense amplifier SA, the N-channel transistor being connected to the local bit line the potential of which has dropped and come close to VSS, turns on and a state is brought about where the local bit line the potential of which has dropped is connected to the common connection line CLN. This state is not limited to the selected column and the same in other columns. FIG. 9 illustrates a state where LBL<3> has turned to H and LBLX<3> to L, and LBLX<3> is connected to CLN, LBL<0> has turned to L and LBLX<0> to H, and LBLX<0> is connected to CLN and the connected local bit line is indicated by a broken line. FIG. 8 illustrates a state where LBL<3> has turned to H and LBLX<3> to L, LBL<0> to LBL<2> have turned to L, and LBLX<0> to LBLX<2> have turned to H. Consequently, a state is brought about where the four local bit lines at L are connected, and therefore, a state is brought about where the capacitance of the local bit lines at L increases four times. In other words, LBLX<3> has a capacitance of the local bit line the length of which is four times because LBL<0> to LBL<2> of the other three columns are connected. After that, LSAE and WL change to L. Even when LSAE changes to L, the state is maintained where LBL<0> to LBL<2> are connected to LBLX<3>.

When WL changes to L, the memory cell of the row in which read is performed is cut off from the pair of local bit lines and maintains the state at that time.

On the other hand, after LSAE changes to L, GC<3> and COL<3> of the selected column of target of write change to H and LBL<3>/LBLX<3> enter the state of being connected to GBL<3>/GBLX<3>. Due to this, a charge share occurs between LBL<3>/LBLX<3> and GBL<3>/GBLX<3> and between LBL<3>/LBLX<3> and RD<3>/RDX<3> and the potential of one of GBL<3>/GBLX<3> and RD<3>/RDX<3> drops by an amount corresponding to the capacitance ratio. For example, when LBLX<3> is at L, the potential of LBLX<3> and RDX<3> drops and the potential of GBL<3> and RD<3> is maintained at H. This operation is the same as in the case of the basic SRAM, however, in the present embodiment, LBLX<3> is connected to LBLX<0> to LBLX<2> and the capacitance increases four times, and therefore, it is possible to increase the amount of drop of the potential of GBLX<3> and RDX<3>. Further, if the amount of drop of potential is the same, it is possible to increase the length of the pair of local bit lines. Even if LBL<3> and GBL<3>, and LBL<3> and RD<3> are connected, the potential of both is VDD, and therefore, the potential hardly changes.

When the charge share occurs and the potential of one of GBL<3>/GBLX<3> and RD<3>/RDX<3> drops by an amount corresponding to the capacitance ratio, GC<3> and COL<3> are changed to L and further, the pair of extended global bit lines is cut off from the pair of global bit lines. Then, GSAE<3> changes to H and GSA drops the potential of one of GBLX<3> and RDX<3> down to L. LBL<3>/LBLX<3> and GBL<3>/GBLX<3> maintain the state where the potential has dropped slightly.

On the other hand, LBL<0>/LBLX<0> to LBL<2>/LBLX<2> of the columns other than the selected column enter the state where the potential of the side that is at L has somewhat risen by the charge share, however, WL is at L, and therefore, the state of the memory cell is not affected.

When GC<3>, COL<3>, and GSAE<3> change to L, LBL<0>/LBLX<0> to LBL<3>/LBLX<3>, GBL<0>/GBLX<0> to GBL<3>/GBLX<3>, and RD<0>/RDX<3> are charged to VDD, respectively.

When the write operation starts, LSAE, LWE, GC<3>, COL<3>, GSAE<3>, and GWE<3> are at L (Low). GSAE is maintained at L during the write operation regardless of the column. GC, COL, GSAE and GWE of other columns are maintained at L during the write operation. Due to this, the pair of local bit lines LBL<3>/LBLX<3>, the pair of global bit lines GBL<3>/GBLX<3>, and the pair of extended global bit lines RD<3>/RDX<3> are in the state of having been charged to VDD, respectively. GBL<3>/GBLX<3> are in the state of being connected to RD<3>/RDX<3>.

In synchronization with the rise of CLK, the local precharge signal LPRE changes to H (High) and the row selection signal WL changes to H and the write data WD/WDX is set. When LPRE turns to H, PC turns off and LBL<3> and LBLX<3> enter the separated state. When any WL within the sub block turns to H, the state of the memory cell where WL of each column has turned to H is read, the potential of the pair of local bit lines of each column changes, and further, LSAE changes to H and enlarges the potential difference at that time and turns one to VDD and the other to VSS. At this time, LBLX<3> enters the state of being connected to LBLX<0> to LBLX<2> as at the time of read.

After that, LSAE changes to L. On the other hand, after LSAE changes to L, COL<3> and GWE<3> of the selected column of target of write change to H and GBL<3>/GBLX<3> change to the state in correspondence to the data WD/WDX. In parallel to this, GC<3> changes to H and LBL<3>/LBLX<3> enter the state of being connected to GBL<3>/GBLX<3> and the state in correspondence to WD/WDX. At this time, LBLX<0> to LBLX<2> connected to LBLX<3> is cut off from CLN when the N-channel transistor of SA turns off as the potential of LBLX<3> (common connection line CLN) rises. When it is possible to set LBL<3>/LBLX<3> to the state of GBL<3>/GBLX<3> by the write driver WC, it may also be possible to maintain GC<3> at L.

Further, the memory cell in which WL of the selected column has turned to H changes to the state in correspondence to LBL<3>/LBLX<3> and it is possible to write the data WD/WDX to the memory cell of target of write. On the other hand, LBL<0>/LBLX<0> to LBL<2>/LBLX<2> in the columns other than the selected column enter the state in correspondence to the stored data of the memory cell in which WL has turned to H and are cut off from GBL<0>/GBLX<0> to GBL<2>/GBLX<2>, and therefore, maintain the state. When WL changes to L, the memory cell in which WL is at H stores the state at that time. Due to this, the memory cell of the selected column enters the state in correspondence to the data WD/WDX and the memory cells in other columns maintain the stored state.

At the same time as WL changes to L, LPRE, LWE, GC<3>, COL<3>, and GWE<3> change to L and LBL<0>/LBLX<0> to LBL<3>/LBLX<3>, GBL<0>/GBLX<0> to GBL<3>/GBLX<3>, and RD<0>/RDX<3> are charged to H, respectively.

In the first embodiment described above, the BL capacitance shared circuit BC is implemented by a sense amplifier, however, it may also be implemented by another circuit. Hereinafter, an SRAM of an embodiment in which the BL capacitance shared circuit BC is implemented by another circuit is explained.

An SRAM of a second embodiment has a general configuration similar to that of the SRAM of the first embodiment and only the configuration of the BL capacitance shared circuit BC is different.

Figure 11:
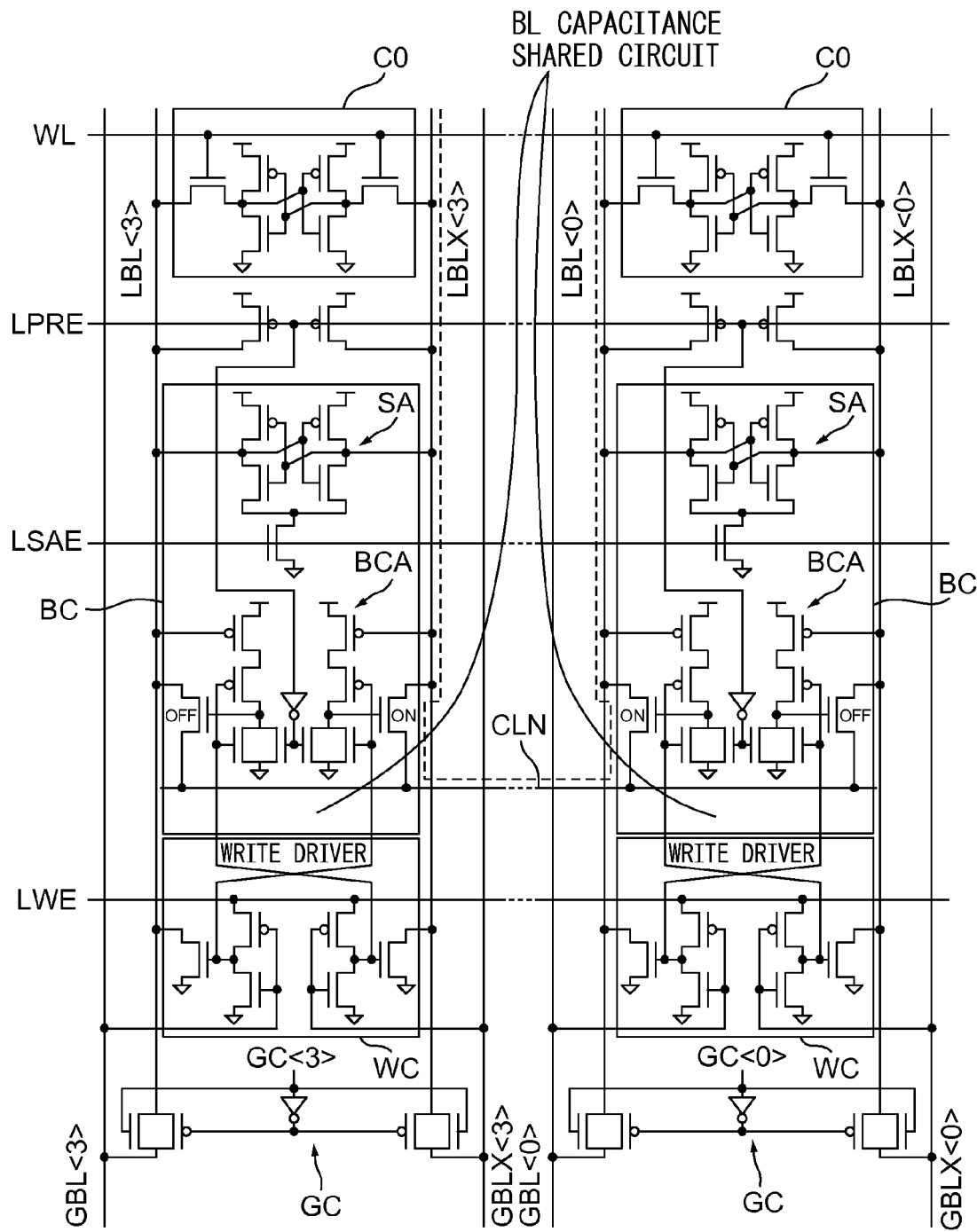
FIG. 11 is a diagram illustrating in detail the one memory cell, the precharge circuit, the BL capacitance shared circuit, the write driver, and the global connection circuit within the sub block as to the column <0> and the column <3> of the SRAM of the second embodiment.

FIG. 11 is a diagram illustrating in detail the one memory cell C0, the precharge circuit, the BL capacitance shared circuit BC, the write driver WC, and the global connection circuit GC within the sub block as to the column <0> and the column <3> of the SRAM of the second embodiment.

As illustrated schematically, the BL capacitance shared circuit BC has the sense amplifier SA and a shared connection circuit BCA. The sense amplifier SA is the sense amplifier illustrated in FIG. 1 and differs from that of the first embodiment in not being connected to the common connection line CLN and others are the same, and therefore, explanation is omitted.

The shared connection circuit BCA has two N-channel transistors and two columns of two P-channel transistors and a transfer gate connected in series between the power source VDD and GND. The two N-channel transistors are connected between the pair of local bit lines and the common connection line CLN and the gate is connected to the connection node of the P-channel transistor and the transfer gate. The gate of the P-channel transistor in the first stage is connected to the pair of local bit line, respectively. The P-channel transistor in the second stage and one of the gate inputs of the transfer gate are connected to the output control signal terminal of the write driver WC on the opposite output side. To the other gate of the transfer gate, a signal, which is the inverted local precharge signal LPRE, is applied.

In the shared connection circuit BCA, the two N-channel transistors turn on when LPRE is at H, LWE is at L or WC writes data different from the previous data, and the local bit line turns to L.

The SRAM of the second embodiment operates in accordance with the time chart illustrated in FIG. 10. A case where LSAE is changed to H is explained. As illustrated in FIG. 10, at the time of read operation and when LSAE is changed to H, LPRE and WL are at H and LWE is at L. When LSAE is changed to H, one of the pair of local bit lines changes to L and in the shared connection circuit BCA, the transistor of the two N-channel transistors, which is connected to the local bit line at L, turns on. Due to this, the state is brought about where the four local bit lines are connected. At the time of write operation, the same operation as that of the read operation is performed in the first half and in the shared connection circuit BCA, one of the two N-channel transistors turns on and the state is brought about where the four local bit lines are connected. Other operations are the same as those in the first embodiment, and therefore, explanation is omitted.

In the second embodiment, the BL capacitance shared circuit BC has the sense amplifier SA and the shared connection circuit BCA, however, without the provision of the sense amplifier SA, the same operation is performed. When no sense amplifier is provided in the sub block, the operation is the same as that of the basic SRAM explained in FIG. 4. In that case, the difference from the basic SRAM lies in that one of the two N-channel transistors of the shared connection circuit BCA turns on in accordance with the potential of the local bit line and the state is brought about where the four local bit lines are connected.

Figure 12:
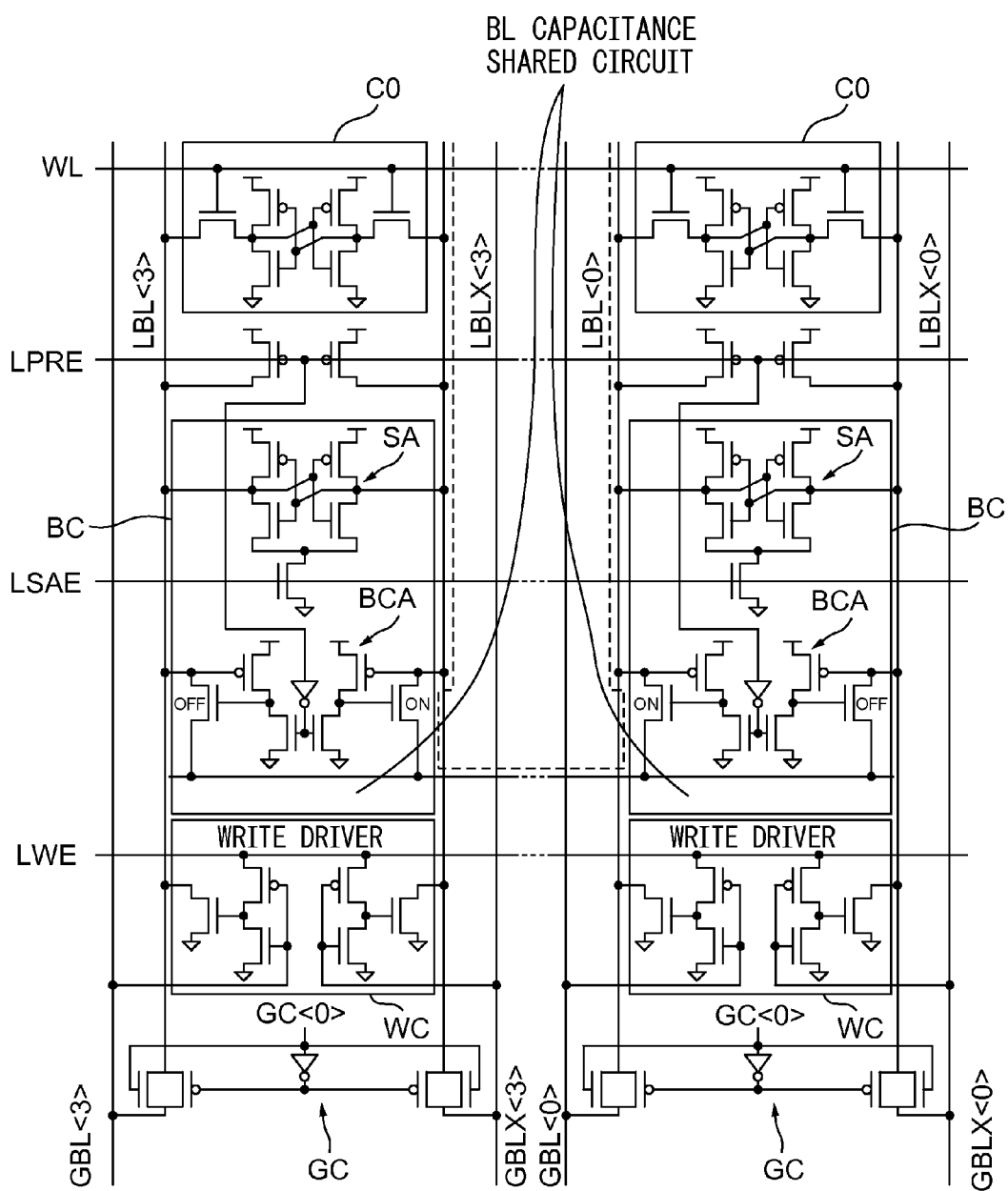
FIG. 12 is a diagram illustrating in detail the one memory cell, the precharge circuit, the BL capacitance shared circuit, the write driver, and the global connection circuit within the sub block as to the column <0> and the column <3> of an SRAM of a third embodiment.

FIG. 12 is a diagram illustrating in detail the one memory cell C0, the precharge circuit, the BL capacitance shared circuit BC, the write driver WC, and the global connection circuit GC within the sub block as to the column <0> and the column <3> of an SRAM of a third embodiment.

As illustrated schematically, the BL capacitance shared circuit BC has the sense amplifier SA and the shared connection circuit BCA. The sense amplifier SA is the sense amplifier illustrated in FIG. 1 and differs from that of the first embodiment in not being connected to the common connection line CLN and others are the same, and therefore, explanation is omitted.

The shared connection circuit BCA has two N-channel transistors and two columns of one P-channel transistor and N-channel transistor connected in series between the power source VDD and GND. The two N-channel transistors are connected between the pair of local bit lines and the common connection line CLN and the gate is connected to the connection node of the P-channel transistor and the N-channel transistor in the corresponding column. The gate of the P-channel transistor in the first stage is connected to the pair of local bit line, respectively. To the gate of the transistor forming the column, a signal, which is the inverted local precharge signal LPRE, is applied.

In the shared connection circuit BCA, the two N-channel transistors turn on when LPRE is at H and the local bit line turns to L.

Figure 13:
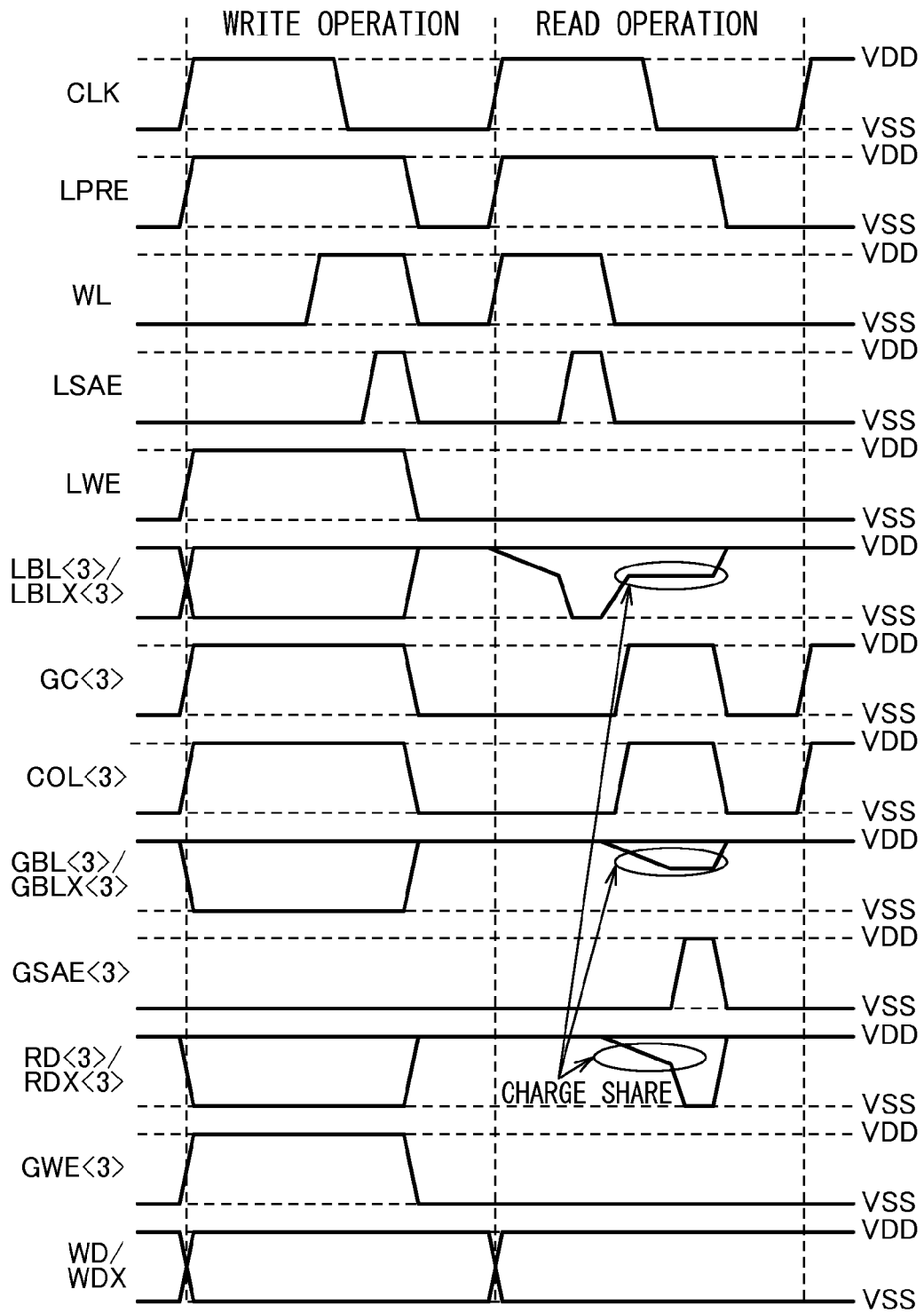
FIG. 13 is the time chart illustrating the operation of the SRAM of the third embodiment.

FIG. 13 is the time chart illustrating the operation of the SRAM of the third embodiment.

The operation at the time of read operation is the same as that of the time chart in FIG. 10, and therefore, explanation is omitted.

When the write operation starts, WL, LSAE, GC<3>, and GSAE<3> are at L (Low). GSAE is maintained at L during the write operation regardless of the column. GC, COL, GSAE, and GWE in other columns are maintained at L during the write operation. Due to this, the pair of global bit lines GBL<3>/GBLX<3> and the pair of extended global bit lines RD<3>/RDX<3> are in the states of having been charged to H, respectively. GBL<3>/GBLX<3> are in the state of being connected to RD<3>/RDX<3>. The pair of local bit lines LBL<3>/LBLX<3> maintains the previous state where one is at H and the other is at L.

In synchronization with the rise of CLK, LPRE, LWE, COL<3>, and GWE<3> change to H (High) and the write data WD/WDX is set. When LPRE turns to H, PC turns off and LBL<3> and LBLX<3> enter the separated state. Further, COL<3> and GWE<3> of the selected column of target of write change to H and GBL<3>/GBLX<3> change to the state in correspondence to the data WD/WDX. In parallel to this, GC<3> changes to H and LBL<3>/LBLX<3> enter the state of being connected to GBL<3>/ GBLX<3> and the state in correspondence to WD/WDX.

Next, when WL turns to H, in the selected column, a state is brought about where the memory cell is connected to LBL<3>/LBLX<3>. On the other hand, in the column not selected, the state of the memory cell where WL has turned to H is read by the pair of local bit lines and the potential of the pair of local bit lines of each column changes. In this state, when LSAE changes to H, in the selected column, a state where the memory where WL is at H is connected to LBL<3>/LBLX<3>, i.e., a state in correspondence to WD/WDX is brought about. On the other hand, in the column not selected, the potential difference in correspondence to the read state of the memory cell is enlarged and one of the pair of local bit lines turns to H and the other to L. At this time, LBLX<3> enters the state of being connected to LBLX<0> to LBLX<2>.

After that, WL changes to L and the memory cell retains the state at that time. In parallel to this, LPRE, LSAE, LWE, GC<3>, COL<3>, and GWE<3> change to L and LBL<0>/ LBLX<0> to LBL<3>/LBLX<3>, GBL<0>/GBLX<0> to GBL<3>/GBLX<3>, and RD<0>/RDX<3> are charged to VDD, respectively.

Figure 14:
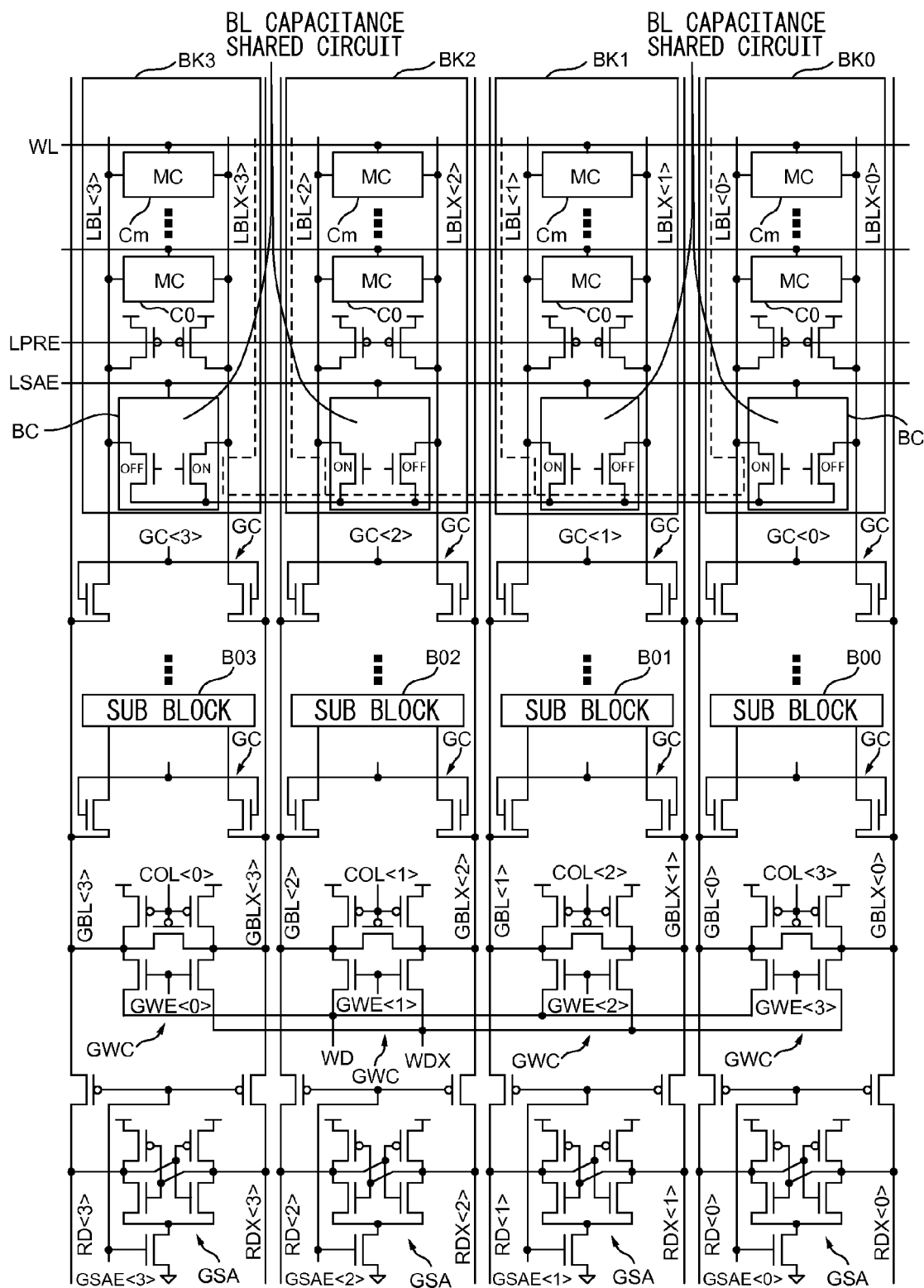
FIG. 14 is a diagram illustrating a configuration of a memory cell matrix of an SRAM of a fourth embodiment.

FIG. 14 is a diagram illustrating a configuration of a memory cell matrix of an SRAM of a fourth embodiment. The SRAM of the fourth embodiment differs from that of the first embodiment in that the write driver WC is removed from the sub blocks B00 to Bk0 . . . B03 to Bk3 and in that the global connection circuit GC has the N-channel transistor in place of the transfer gate.

Figure 15:
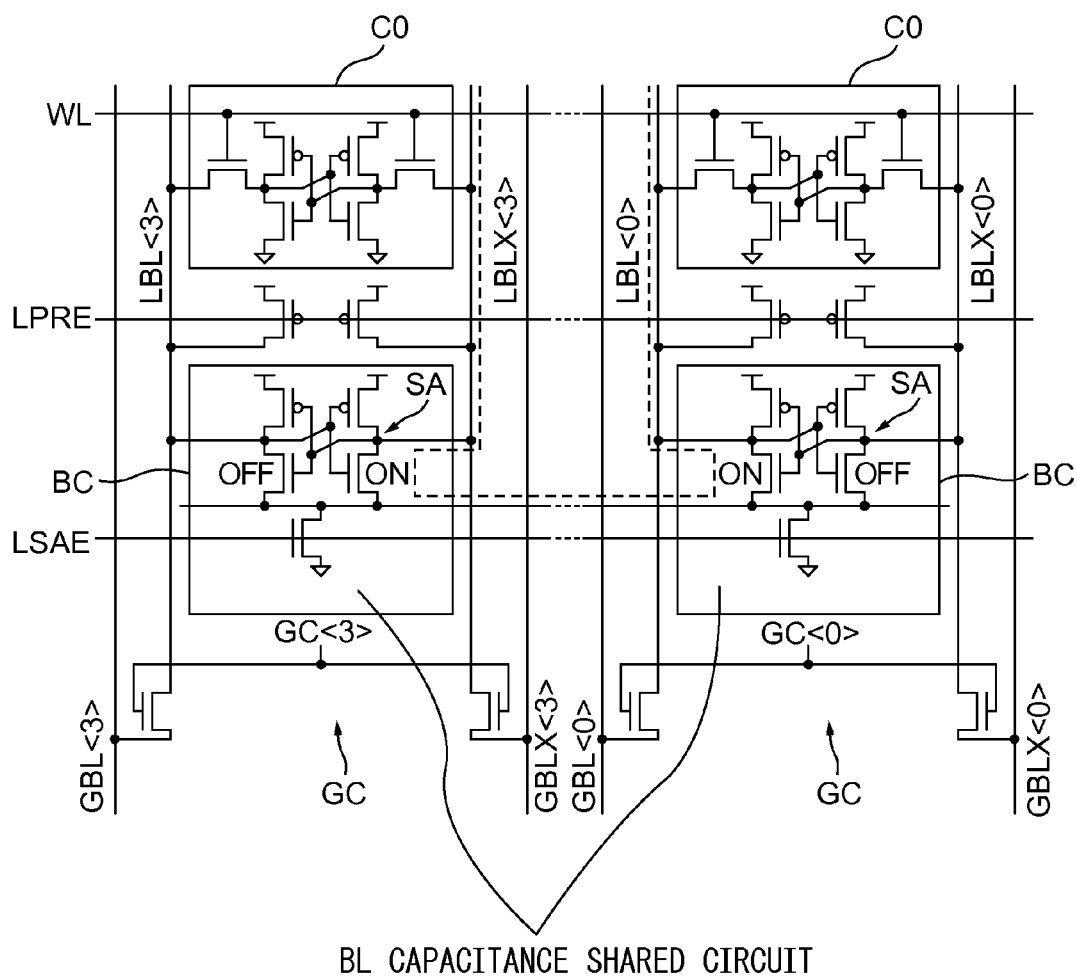
FIG. 15 is a diagram illustrating in details the one memory cell, the precharge circuit, the BL capacitance shared circuit, and the global connection circuit within the sub block as to the column <0> and the column <3> on both sides illustrated in FIG. 14.

FIG. 15 is a diagram illustrating in details the one memory cell C0, the precharge circuit, the BL capacitance shared circuit BC, and the global connection circuit GC within the sub block as to the column <0> and the column <3> on both sides illustrated in FIG. 14. The BL capacitance shared circuit BC includes the sense amplifier as in the first embodiment and is connected to the sense amplifier of another column via the common connection line CLN.

The SRAM of the fourth embodiment operates in accordance with the time chart in FIG. 10.

Figure 16:
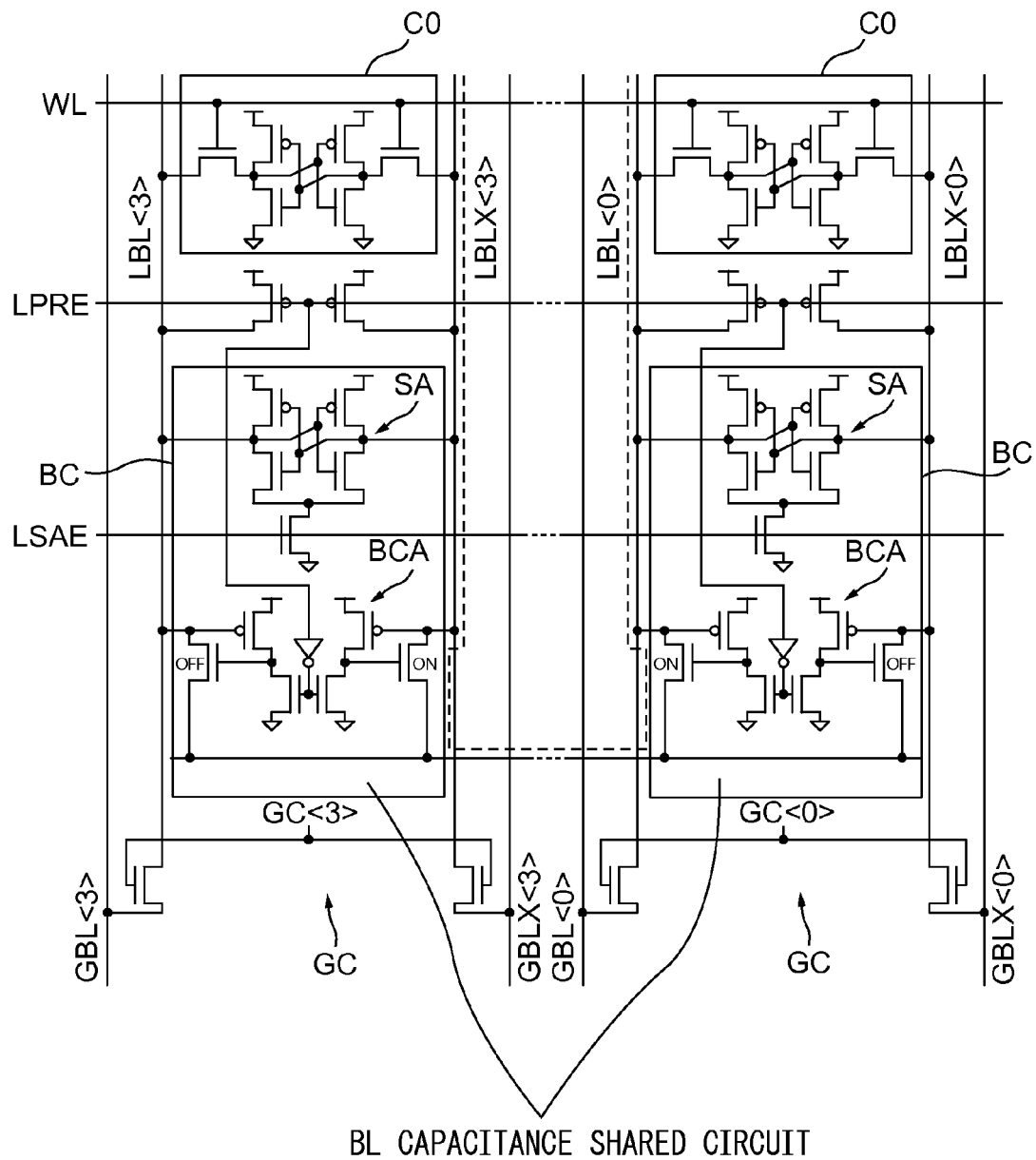
FIG. 16 is a diagram illustrating in details the one memory cell, the precharge circuit, the BL capacitance shared circuit, and the global connection circuit within the sub block as to the column <0> and the column <3> in an SRAM of a fifth embodiment.

FIG. 16 is a diagram illustrating in details the one memory cell C0, the precharge circuit, the BL capacitance shared circuit BC, and the global connection circuit GC within the sub block as to the column <0> and the column <3> in an SRAM of a fifth embodiment.

The SRAM of the fifth embodiment differs from that of the third embodiment in that the write driver WC is removed from the sub blocks B00 to Bk0 . . . B03 to Bk3.

The SRAM of the fifth embodiment operates in accordance with the time chart in FIG. 13.

Figure 17:
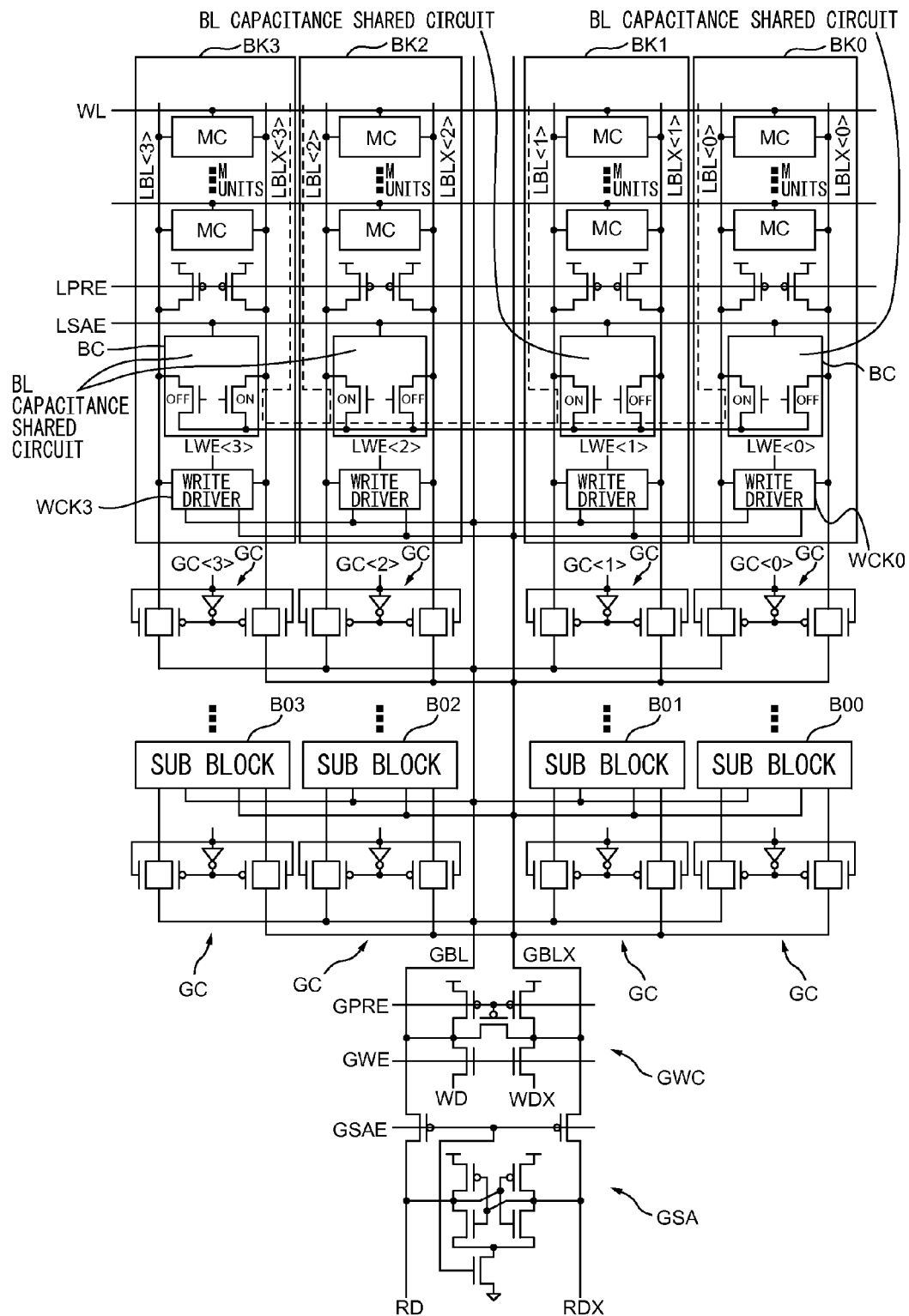
FIG. 17 is a diagram illustrating a configuration of a memory cell matrix of an SRAM of a sixth embodiment.

FIG. 17 is a diagram illustrating a configuration of a memory cell matrix of an SRAM of a sixth embodiment.

The SRAM of the sixth embodiment differs from that of the first embodiment in that the four pairs of global bit lines GBL<0>/GBLX<0> to GBL<3>/GBLX<3> of the four columns are integrated into one pair of global bit lines GBL/

GBLX at the end part. In the SRAM of the sixth embodiment, in accordance with the integration of the pairs of global bit lines, the pairs of extended global bit lines RD<0>/RDX<0> to RD<3>/RDX<3> are integrated into one pair of extended global bit lines RD/RDX. Further, in the SRAM of the sixth embodiment, LWE that activates the write driver WC of each column is separated into LWE<0> to LWE<3>, and therefore, it is possible to control the operating state of each write driver WC independently. Further, the SRAM of the sixth embodiment controls the operating state of the global write circuit GWC to which the global precharge GPRE is integrated in place of COL<0> to COL<3>.

Figure 18:
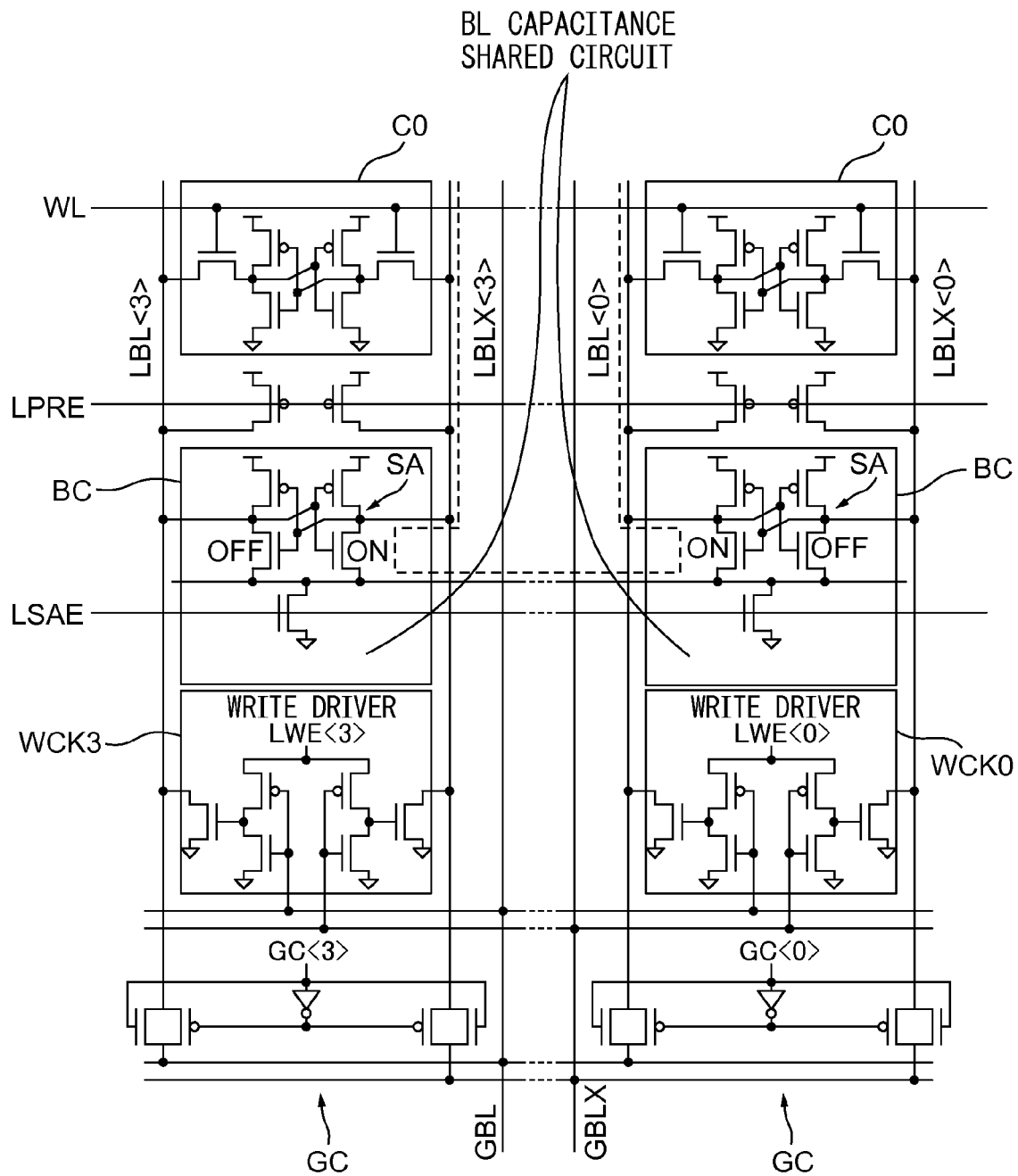
FIG. 18 is a diagram illustrating in details the one memory cell, the precharge circuit, the BL capacitance shared circuit, the write driver, and the global connection circuit within the sub block as to the column <0> and the column <3> on both sides illustrated in FIG. 17.

FIG. 18 is a diagram illustrating in details the one memory cell C0, the precharge circuit, the BL capacitance shared circuit BC, the write driver WC, and the global connection circuit GC within the sub block as to the column <0> and the column <3> on both sides illustrated in FIG. 17.

Figure 19:
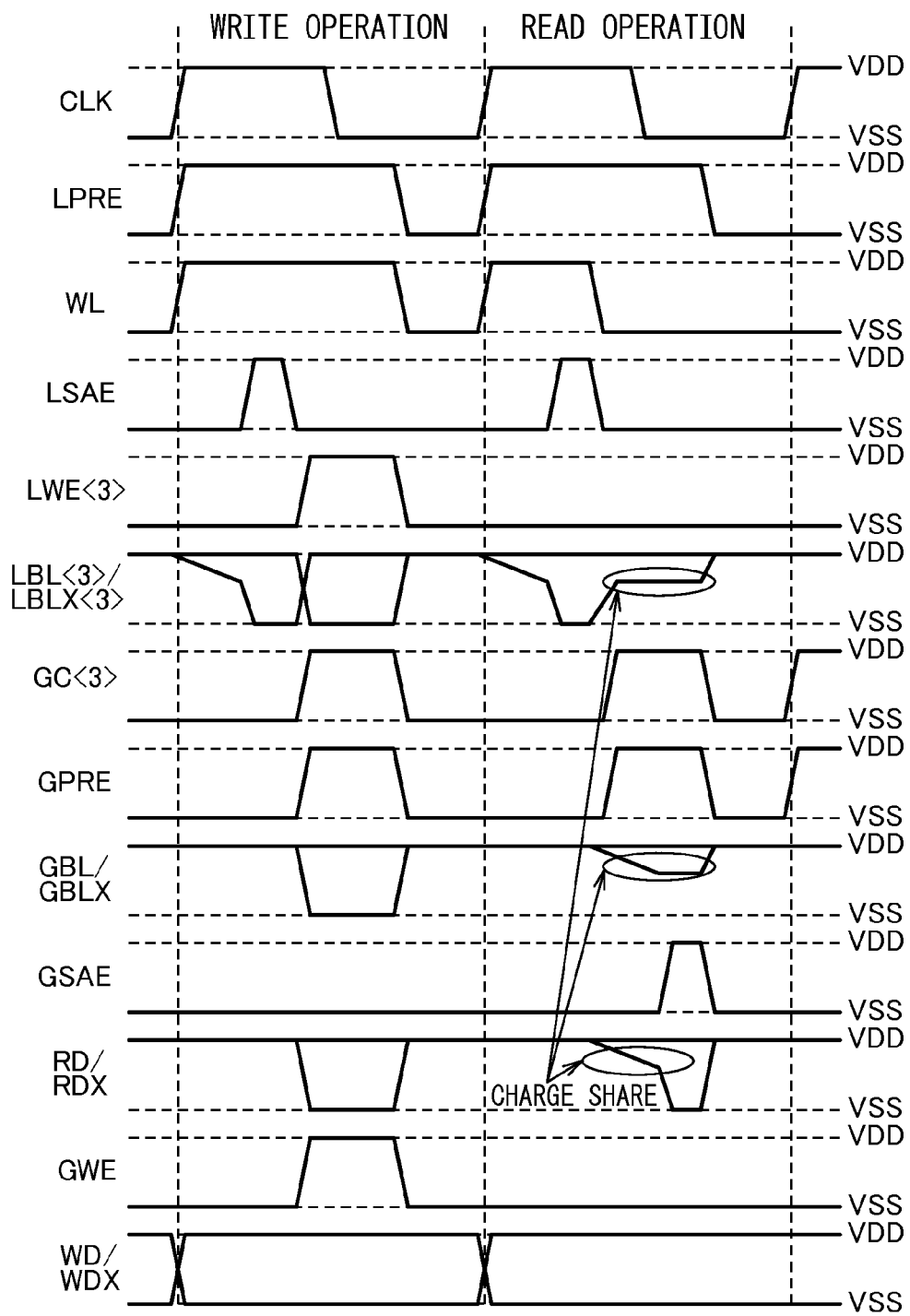
FIG. 19 is a time chart illustrating the operation of the SRAM of the sixth embodiment.

FIG. 19 is a time chart illustrating the operation of the SRAM of the sixth embodiment. As illustrated in FIG. 19, in the sixth embodiment, at the time of write operation, LWE<3> and GPRE change to H and return to L at the same timing as that of GC<3> and GWE. Explanation of the operation is the same as that of the first embodiment, and therefore, omitted.

An SRAM of a seventh embodiment has a configuration similar to that of the SRAM of the sixth embodiment illustrated in FIG. 17 and the BL capacitance shared circuit BC has the same configuration as that of the BL capacitance shared circuit BC of the second embodiment.

Figure 20:
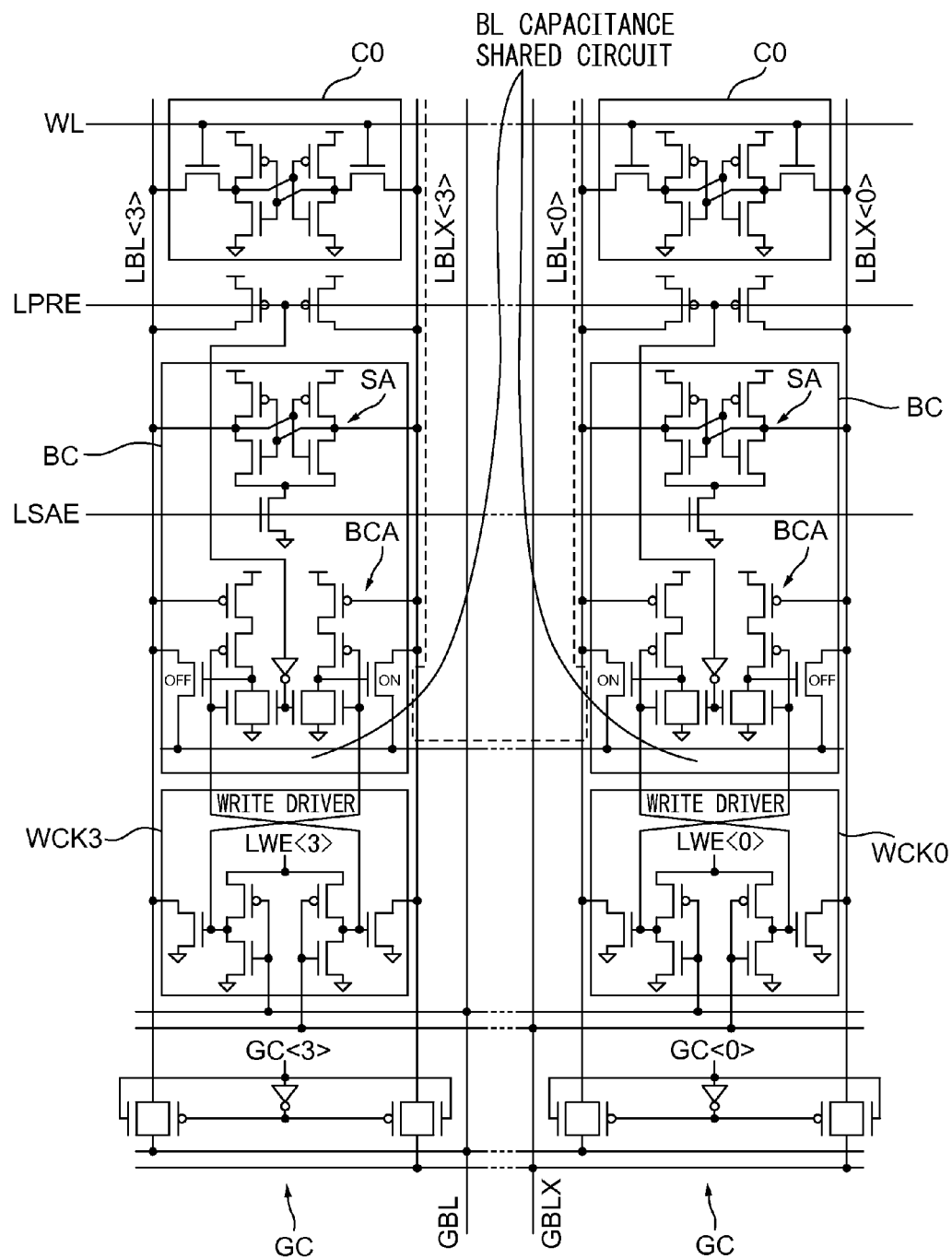
FIG. 20 is a diagram illustrating in details the one memory cell, the precharge circuit, the BL capacitance shared circuit, the write driver, and the global connection circuit within the sub block as to the column <0> and the column <3> in the SRAM of the seventh embodiment.

FIG. 20 is a diagram illustrating in details the one memory cell C0, the precharge circuit, the BL capacitance shared circuit BC, the write driver WC, and the global connection circuit GC within the sub block as to the column <0> and the column <3> in the SRAM of the seventh embodiment.

The SRAM of the seventh embodiment has a general configuration similar to that of the SRAM of the sixth embodiment and the BL capacitance shared circuit BC is similar to that explained in the second embodiment, and therefore, explanation is omitted.

The SRAM of the seventh embodiment operates in accordance with the time chart in FIG. 19.

An SRAM of an eighth embodiment has a configuration similar to that of the SRAM of the sixth embodiment and the BL capacitance shared circuit BC has the same configuration as that of the BL capacitance shared circuit BC of the third embodiment.

Figure 21:
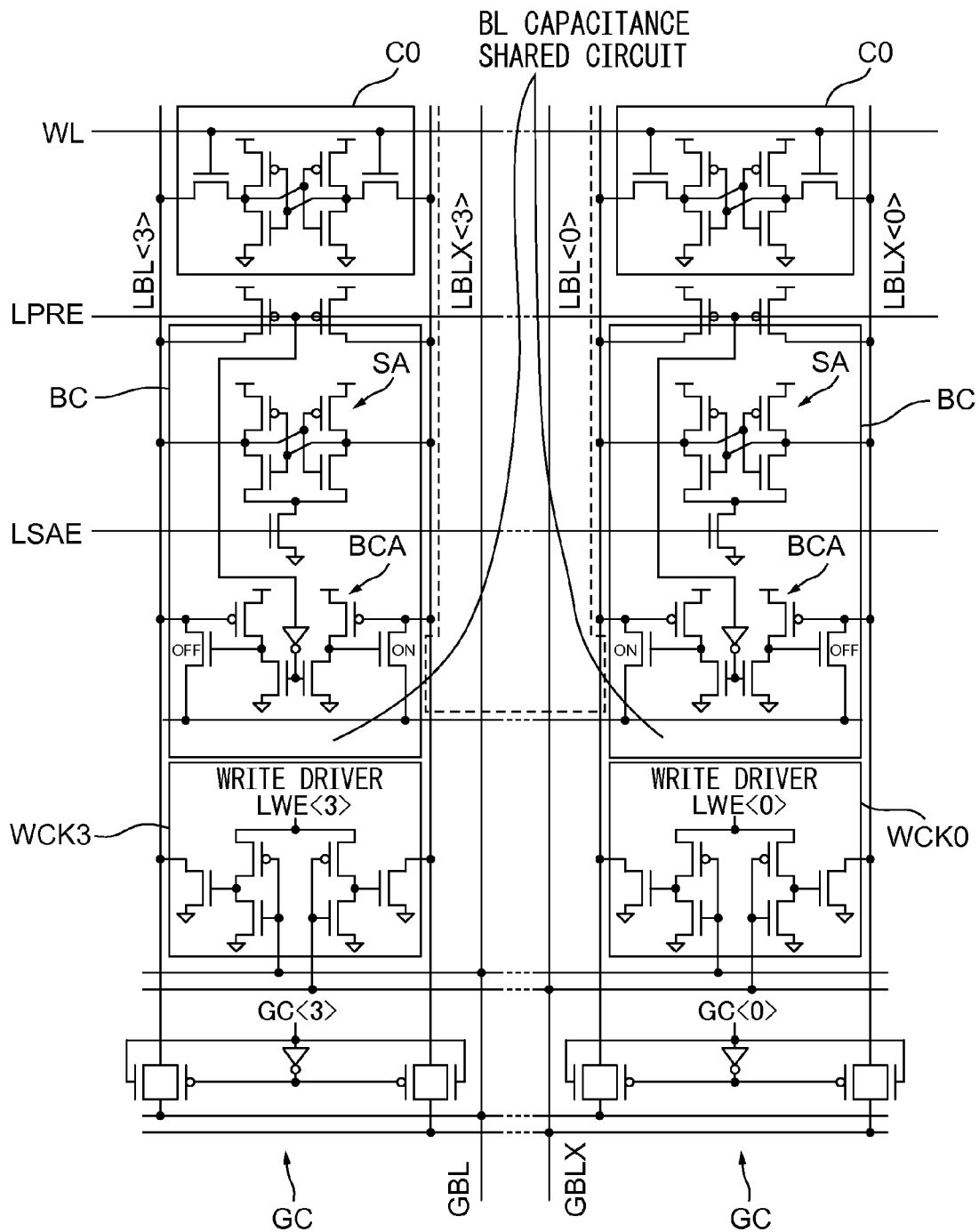
FIG. 21 is a diagram illustrating in details the one memory cell, the precharge circuit, the BL capacitance shared circuit, the write driver, and the global connection circuit within the sub block as to the column <0> and the column <3> in the SRAM of the eighth embodiment.

FIG. 21 is a diagram illustrating in details the one memory cell C0, the precharge circuit, the BL capacitance shared circuit BC, the write driver WC, and the global connection circuit GC within the sub block as to the column <0> and the column <3> in the SRAM of the eighth embodiment.

Figure 22:
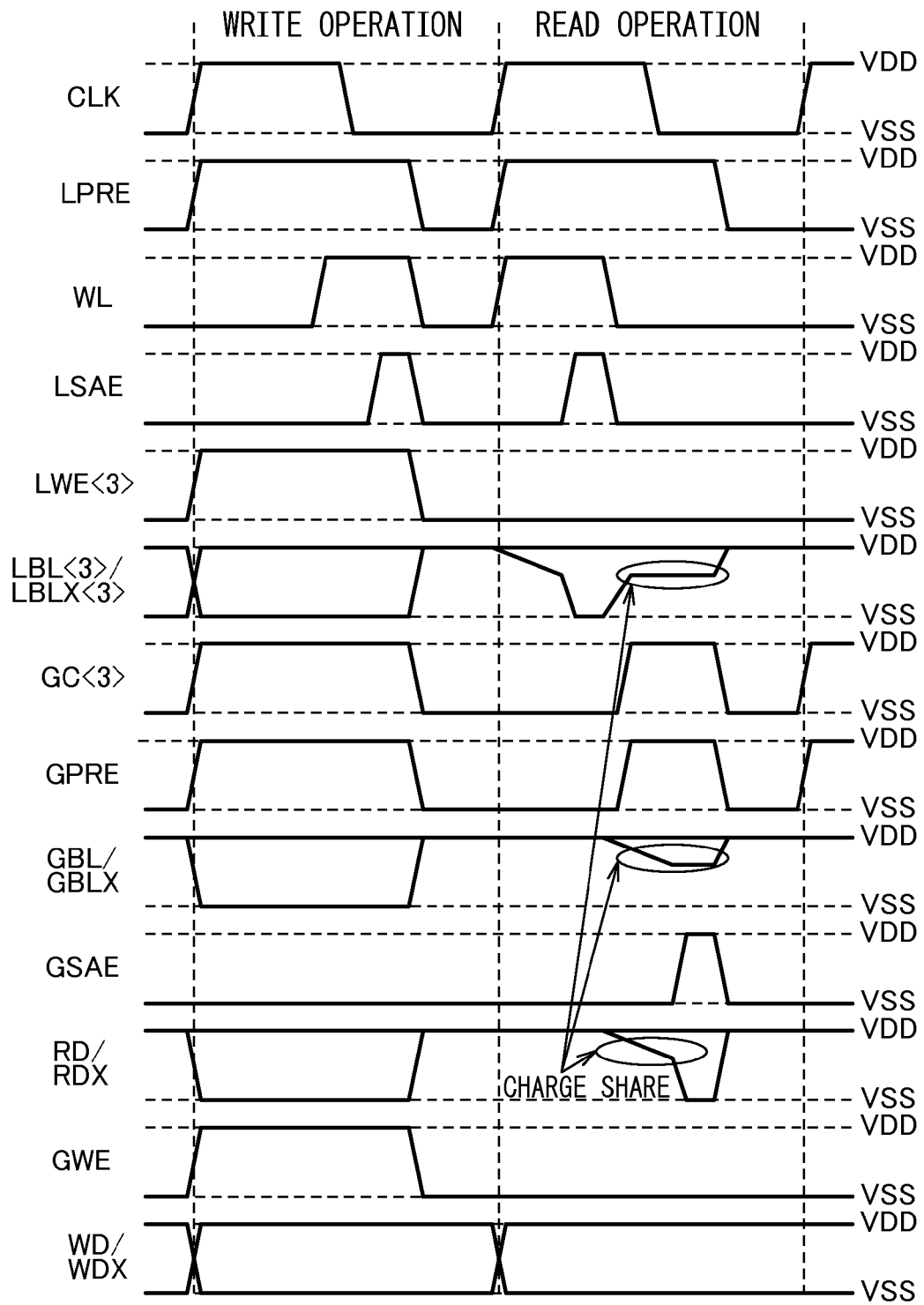
FIG. 22 is a time chart illustrating the operation of the SRAM of the eighth embodiment.

FIG. 22 is a time chart illustrating the operation of the SRAM of the eighth embodiment. As illustrated in FIG. 22, in the eighth embodiment, at the time of write operation, LWE<3> and GPRE change to H and return to L at the same timing as that of GC<3> and GWE. Explanation of the operation is the same as that of the third embodiment, and therefore, is omitted.

Figure 23:
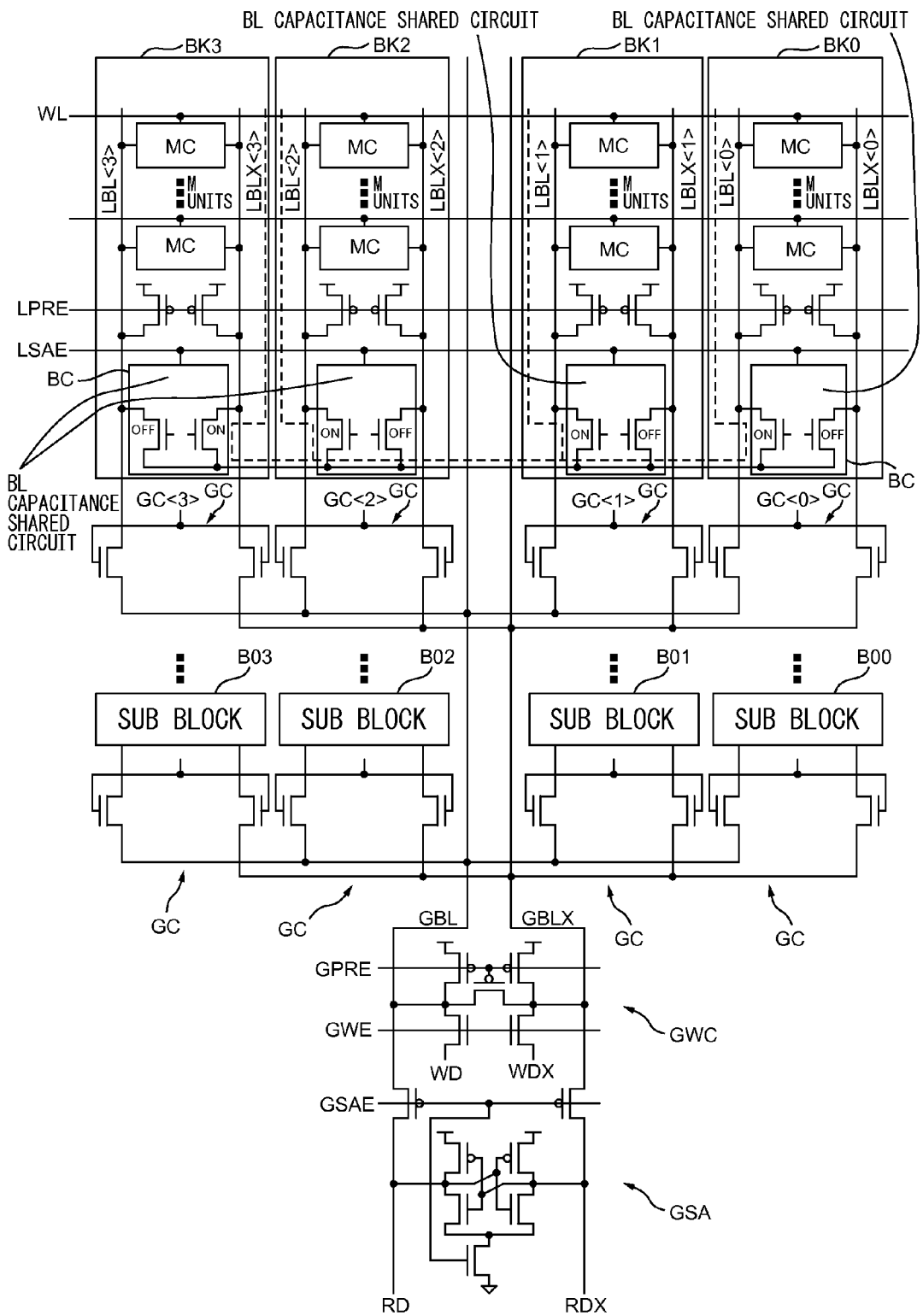
FIG. 23 is a diagram illustrating a configuration of a memory cell matrix of an SRAM of a ninth embodiment.

FIG. 23 is a diagram illustrating a configuration of a memory cell matrix of an SRAM of a ninth embodiment.

The SRAM of the ninth embodiment differs from that of the fourth embodiment in that the four pairs of global bit lines GBL<0>/GBLX<0> to GBL<3>/GBLX<3> of the four columns are integrated into one pair of global bit lines GBL/GBLX at the end part. The integration of the pair of global bit lines, the pair of extended global bit lines, the global write circuit, and the global sense amplifier is performed as in the sixth embodiment.

Figure 24:
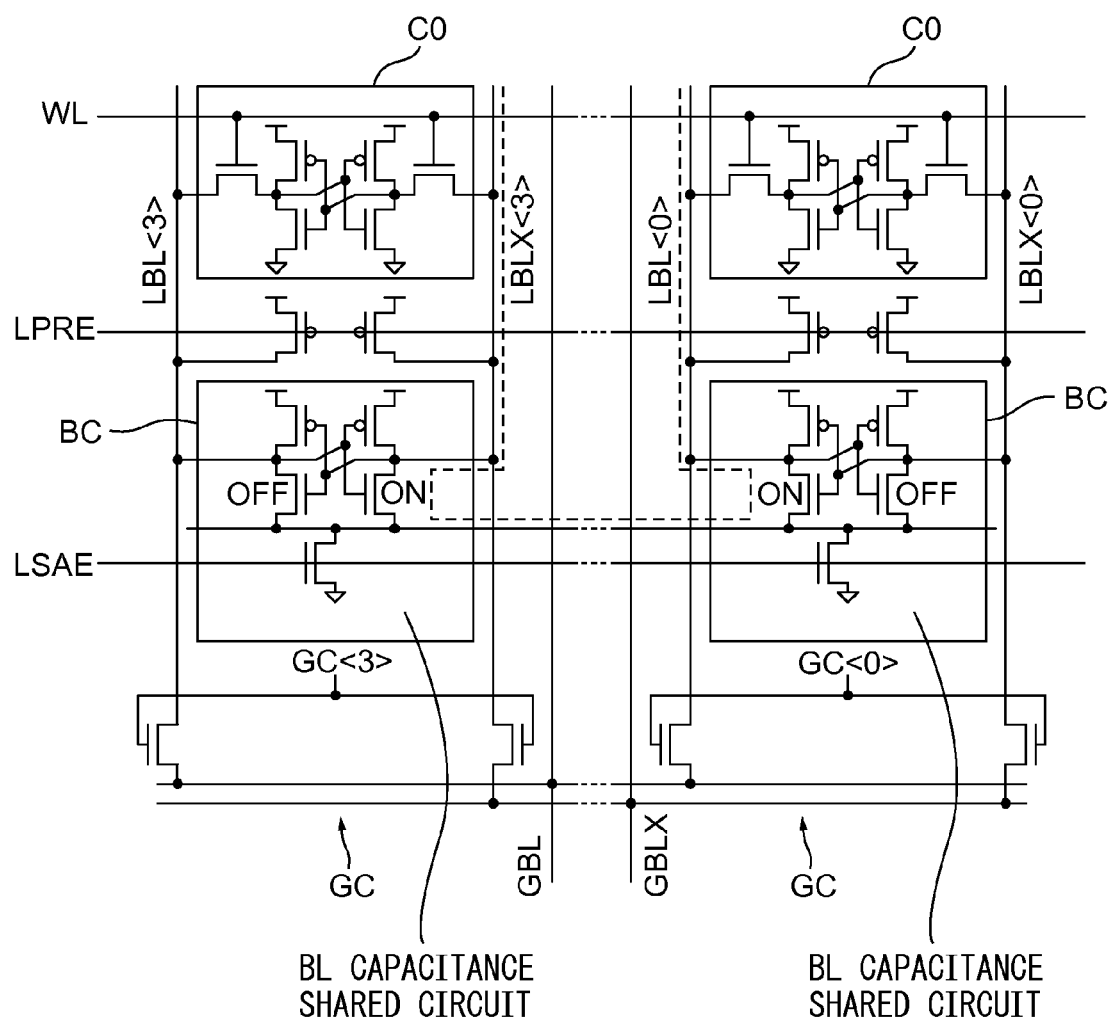
FIG. 24 is a diagram illustrating in details the one memory cell, the precharge circuit, the BL capacitance shared circuit, and the global connection circuit within the sub block as to the column <0> and the column <3> on both sides illustrated in FIG. 23.

FIG. 24 is a diagram illustrating in details the one memory cell C0, the precharge circuit, the BL capacitance shared circuit BC, and the global connection circuit GC within the sub block as to the column <0> and the column <3> on both sides illustrated in FIG. 23.

The SRAM of the ninth embodiment has a general configuration similar to that of the SRAM of the fourth embodiment and the integration of the pairs of global bit lines, etc., is similar to that in the sixth embodiment, and therefore, explanation is omitted.

The SRAM of the ninth embodiment operates in accordance with the time chart in FIG. 10.

Figure 25:
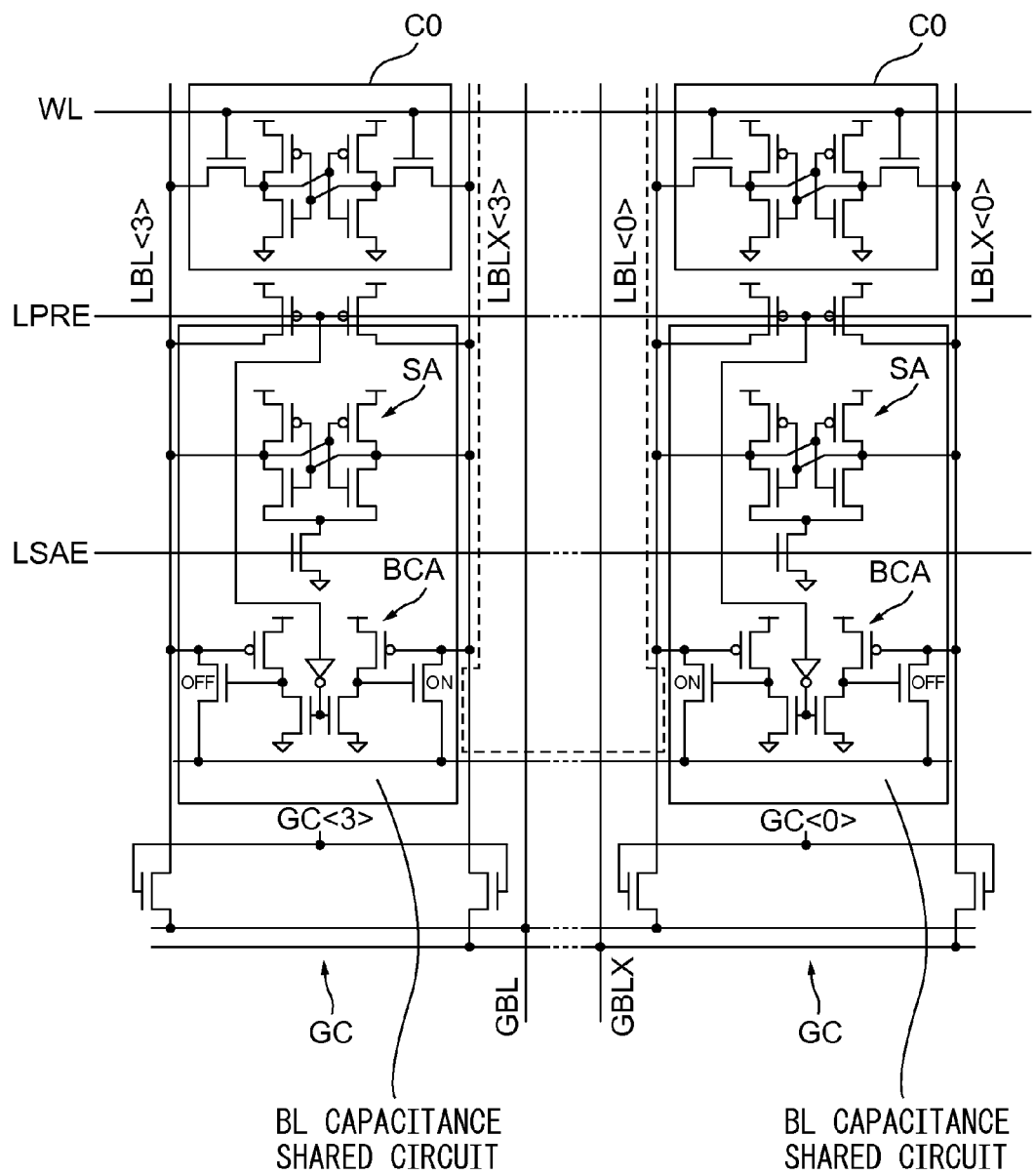
FIG. 25 is a diagram illustrating in details the one memory cell, the precharge circuit, the BL capacitance shared circuit, and the global connection circuit within the sub block as to the column <0> and the column <3> on both sides in an SRAM of a tenth embodiment.

FIG. 25 is a diagram illustrating in details the one memory cell C0, the precharge circuit, the BL capacitance shared circuit BC, and the global connection circuit GC within the sub block as to the column <0> and the column <3> on both sides in an SRAM of a tenth embodiment.

The SRAM of the tenth embodiment has a general configuration similar to that of the SRAM of the fifth embodiment and the integration of the pairs of global bit lines, etc., is similar to that in the sixth embodiment, and therefore, explanation is omitted.

The SRAM of the tenth embodiment operates in accordance with the time chart in FIG. 13.

It is possible for a person skilled in the art to easily understand that other configurations may be effective even when the combinations of the configuration of each unit explained above are changed and used. For example, it is possible to arbitrarily set the number of columns connected by the common connection line CLN.

It is known to configure a pair of bit lines in a hierarchical structure to reduce power consumption, however, amplification is performed so that the bit lines have a large enough capacity to handle large changes in amplitude, and therefore, power consumption is not sufficiently reduced.

According to the embodiments, an SRAM the power consumption of which has been reduced while maintaining the operating speed and reliability is realized.

In an SRAM according to the embodiments, after voltages of one pair of the local bit lines, each of which includes a comparatively low capacity, are changed, local bit lines of the pairs having low voltages are connected to each other, and global bit lines are further connected to change voltages of the global bit lines due to the charge share.

All examples and conditional language provided herein are intended for pedagogical purposes of aiding the reader in understanding the invention and the concepts contributed by the inventor to furthering the art, and are to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A static random access memory (RAM) comprising:
a plurality of word lines;
a plurality of pairs of local bit lines;
a plurality of memory cells arranged in correspondence with intersections of the plurality of pairs of local bit lines and the plurality of word lines;

a plurality of capacitance shared circuits each arranged for each of the plurality of pairs of local bit lines;

a common connection line connecting the plurality of capacitance shared circuits; and a pair of global bit lines connected to the plurality of pairs of local bit lines, wherein:

each capacitance shared circuit comprises two N-channel transistors connected between the pair of local bit lines and the common connection line corresponding to each other, a drain of one of the two N-channel transistors is connected to one of the pair of local bit lines, a drain of the other of the two N-channel transistors is connected to the other of the pair of local bit lines, and sources of the two N-channel transistors are connected to the common connection line.

2. The static RAM according to claim 1, wherein:

the plurality of memory cells are connected to a corresponding pair of local bit lines in accordance with a row selection signal to be applied to a word line of the plurality of word lines, when the plurality of local bit lines are placed into a state based on contents stored in the memory cell of each pair of local bit lines by applying the row selection signal to the word line corresponding to a memory cell to be selected, the capacitance shared circuit corresponding to each pair of local bit lines places one of the two N-channel transistors into a conduction state in accordance with a potential of the corresponding pair of local bit lines and places the other N-channel transistor into a cut-off state, the N channel transistor to be connected to the local bit line on a low potential side of the two N-channel transistors is placed into the conduction state, and the local bit lines on a low potential side of the plurality of pairs of local bit lines are connected to one another via the common connection line.

3. The static RAM according to claim 2, wherein:

application of the row selection signal is stopped in a state where the local bit lines on the low potential side of the plurality of pairs of local bit lines are connected to one another, a state of the pair of global bit lines is changed by connecting one of the pair of global bit lines to a local bit line on the high potential side of the pair of local bit lines of a selected column and the other global bit line to a local bit line on the low potential side of the plurality of pairs of local bit lines connected via the local bit line on the low potential side of the selected column and the common connection line, and the global sense amplifier is operated.

4. The static RAM according to claim 3, wherein the plurality of capacitance shared circuits each include a local sense amplifier provided for each of the plurality of pairs of local bit lines and started by a common local sense amplifier start signal.

5. The static RAM according to claim 4, wherein:

the local sense amplifier comprises the two N-channel transistors, and when the plurality of pairs of local bit lines are placed into a state in accordance with the contents stored in the memory cell of each pair of local bit lines, each of the local sense amplifiers is started by applying the local sense amplifier start signal.

* * * * *